(12) United States Patent
Razzak et al.

(10) Patent No.: US 11,961,563 B2
(45) Date of Patent: Apr. 16, 2024

(54) BALANCING PEAK POWER WITH PROGRAMMING SPEED IN NON-VOLATILE MEMORY

(71) Applicant: SanDisk Technologies LLC, Addison, TX (US)

(72) Inventors: Towhidur Razzak, Santa Clara, CA (US); Jiahui Yuan, Fremont, CA (US); Deepanshu Dutta, Fremont, CA (US)

(73) Assignee: SanDisk Technologies LLC, Austin, TX (US)

( * ) Notice: Subject to any disclaimer, the term of this patent is extended or adjusted under 35 U.S.C. 154(b) by 147 days.

(21) Appl. No.: 17/825,321

(22) Filed: May 26, 2022

(65) Prior Publication Data

US 2023/0410911 A1 Dec. 21, 2023

(51) Int. Cl.
| | |
|---|---|
| *G11C 16/10* | (2006.01) |
| *G11C 16/04* | (2006.01) |
| *G11C 16/08* | (2006.01) |
| *G11C 16/34* | (2006.01) |
| *H01L 25/065* | (2023.01) |

(52) U.S. Cl.
CPC .......... *G11C 16/10* (2013.01); *G11C 16/0483* (2013.01); *G11C 16/08* (2013.01); *G11C 16/3459* (2013.01); *H01L 25/0657* (2013.01); *H01L 2225/06562* (2013.01)

(58) Field of Classification Search
CPC ..... G11C 16/10; G11C 16/0483; G11C 16/08; G11C 16/3459; H01L 25/0657; H01L 2225/06562
See application file for complete search history.

(56) References Cited

U.S. PATENT DOCUMENTS

| | | | |
|---|---|---|---|
| 9,336,892 B1 | 5/2016 | Chen et al. | |
| 9,466,369 B1 | 10/2016 | Pang et al. | |
| 9,887,002 B1 | 2/2018 | Zhang et al. | |
| 10,468,111 B1 | 11/2019 | Yang et al. | |
| 11,189,337 B1 | 11/2021 | Lien et al. | |
| 11,270,776 B1 * | 3/2022 | Lien ......... | G11C 16/24 |
| 2008/0019180 A1 | 1/2008 | Wan et al. | |
| 2019/0318792 A1 * | 10/2019 | Yang ........... | G11C 11/5642 |
| 2020/0118630 A1 * | 4/2020 | Lin ............ | G11C 16/08 |
| 2021/0375349 A1 * | 12/2021 | Lien .......... | G11C 11/4085 |
| 2021/0375371 A1 * | 12/2021 | Lien .......... | G11C 16/0483 |
| 2022/0223214 A1 * | 7/2022 | Lien .......... | G11C 16/3454 |
| 2022/0319605 A1 * | 10/2022 | Lien .......... | G11C 16/10 |

* cited by examiner

*Primary Examiner* — Tuan T Nguyen
(74) *Attorney, Agent, or Firm* — Vierra Magen Marcus LLP

(57) ABSTRACT

Technology is disclosed herein for a memory system that balances peak Icc with programming speed. A memory system applies voltages to respective word lines during a verify operation that balances peak Icc with programming speed. The voltages for which the ramp rate is controlled include a read pass voltage applied to unselected word lines and a spike voltage applied to the selected word line at the beginning of the verify. The ramp rate of the voltages is slow enough to keep the peak Icc during verify to a target peak Icc regardless of which word line is selected for verify. However, the ramp rate of the voltages to the word lines during verify is fast enough to make use of the target peak Icc in order achieve faster programming. Therefore, the impact on programming time is minimized while staying within the allowed peak Icc.

20 Claims, 20 Drawing Sheets

700

800

| Code | WL Zone | Ramp Rate |
|---|---|---|
| 0000 | Zone 1 | Rate 1 |
| 0001 | Zone 2 | Rate 2 |
| 0010 | Zone 3 | Rate 3 |
| 0011 | Zone 4 | Rate 4 |
| 0100 | Zone 5 | Rate 5 |
| 0101 | Zone 6 | Rate 6 |
| 0110 | Zone 7 | Rate 7 |
| 0111 | Zone 8 | Rate 8 |
| 1000 | Zone 9 | Rate 9 |
| 1001 | Zone 10 | Rate 10 |
| 1010 | Zone 11 | Rate 11 |
| 1011 | Zone 12 | Rate 12 |
| 1100 | Zone 13 | Rate 13 |
| 1101 | Zone 14 | Rate 14 |
| 1110 | Zone 15 | Rate 15 |
| 1111 | Zone 16 | Rate 16 |

BALANCING PEAK POWER WITH PROGRAMMING SPEED IN NON-VOLATILE MEMORY

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with materials including a charge-trapping material to create a vertical column of memory cells (e.g., NAND string). The semiconductor fabrication process for forming a three-dimensional memory structure may result in location dependent physical differences between similar structures.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of programming voltage pulses are applied to the control gates of the memory cells. Each voltage pulse may be stepped up in magnitude from a previous program pulse by a step size in a processed referred to as incremental step pulse programming. Each program voltage may be followed by a verify operation to determine if the respective memory cells have been programmed to the desired memory state. Thus, the program operation may include a number of program/verify loops.

The time to complete the entire program operation can be considerable. The word line that is connected to the memory cells being verified is referred to herein as the "selected word line." The remaining word lines connected to other memory cells on the NAND strings are referred to herein as "unselected word lines."

There are often limits to the peak current that can be provided from the host device to the memory system. The term "peak Icc" is used to refer to the peak amount of current that is drawn by the memory system. The term "Icc" is typically used to refer to a current provided to the memory system by a power source. The term "specified peak Icc" refers to a maximum allowed peak Icc. For example, there may be a specification that defines the specified peak Icc. If the peak current drawn by the memory system is greater than the specified peak Icc, then the magnitude of the supply voltage may drop, which can result in operation failure in the memory system. Much of the power and/or current that is used by the memory system is used to perform memory operations such as programming the memory cells on the memory dies. Hence, the regulation of the power and/or current used by the memory dies is important in order to keep the peak Icc of the memory system within the specified peak Icc. Thus, it is common to limit the amount of power and/or current that may be drawn by the memory system to a specified peak Icc.

BRIEF DESCRIPTION OF THE DRAWINGS

Like-numbered elements refer to common components in the different figures.

DETAILED DESCRIPTION

Technology is disclosed herein for a memory system that balances peak Icc with programming speed. An embodiment of a memory system applies voltages to respective word lines during a verify operation that balances peak Icc with programming speed. In an embodiment, the voltages for which the ramp rate is controlled include a read pass voltage (e.g., Vread) that is applied to unselected word lines. In an embodiment, the voltages for which the ramp rate is controlled includes a spike voltage that is applied to the selected word line at the beginning of the verify.

A very large peak Icc can be drawn by the memory system when ramping of voltages on word lines during a verify operation. Slowing down the ramp rate of the voltage may reduce the peak Icc. However, slowing down the ramp rate may increase the time it takes to complete the verify. Moreover, a program operation typically contains multiple program/verify loops. Therefore, the overall time it takes to complete the program operation (referred to herein as Tprog) can be increased considerably by slowing the ramp rate. Furthermore, there may be considerable variation in peak Icc depending on which memory cells are being verified, assuming a default ramp rate is used. For example, ramping the voltages to the respective word lines at a default ramp rate during verify of memory cells connected to a selected word line has what is referred to herein as a default peak Icc. The default peak current may differ significantly depending on which word line is the selected word line.

In an embodiment, the ramp rate of the voltages to the word lines during verify is slow enough to keep the peak Icc during verify to a target peak Icc regardless of which word line is selected for verify. However, in an embodiment, the ramp rate of the voltages to the word lines during verify is fast enough to make use of the target peak Icc in order achieve faster programming. Therefore, the ramp rate that is used during verify can vary significantly depending on the location of the selected word line in order to speed up programming while keeping within the allowed peak Icc. Therefore, the impact on programming time is minimized while staying within the allowed peak Icc. The target peak Icc may be based on the specified peak Icc. For example, the target peak Icc could be equal to the specified peak Icc; however, the target peak Icc is not required to be equal to the specified peak Icc.

Figure 1:
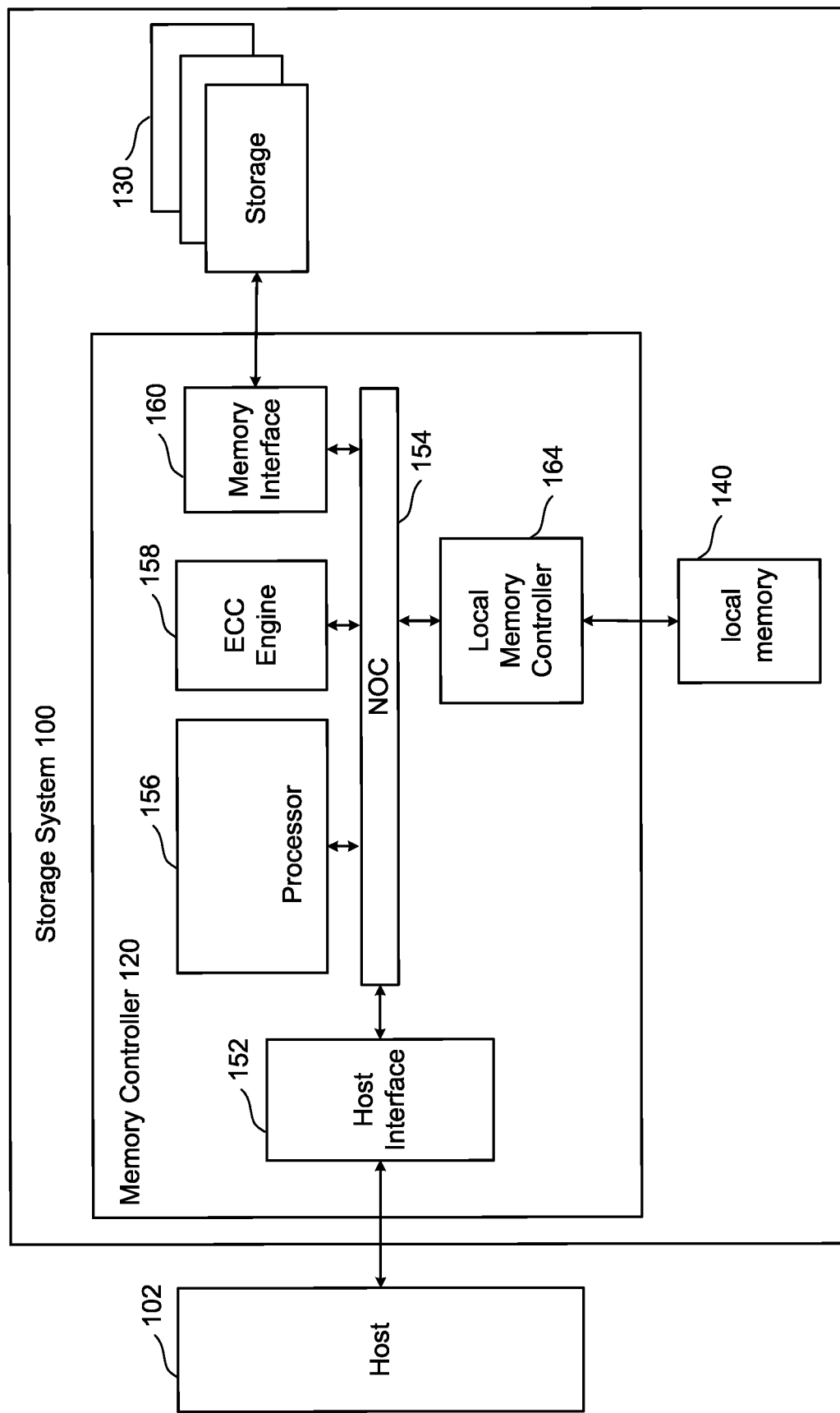
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system.

The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
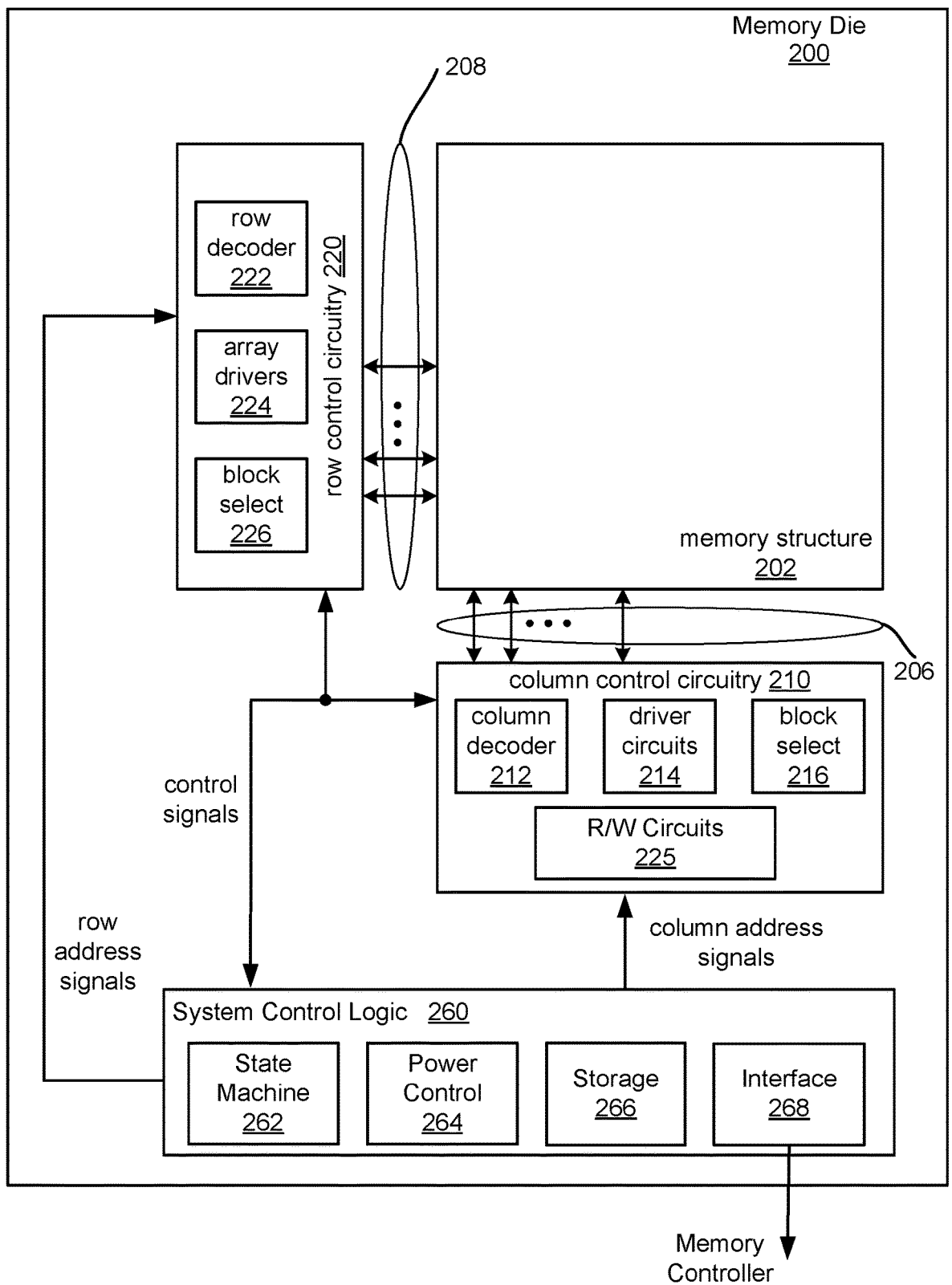
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Such parameters may include a ramp rate for a voltage applied to a word line during a verify operation, as disclosed herein. In an embodiment, the word lines are divided into zones based on their location in a block of memory cells. There may be a separate ramp rate for each zone.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
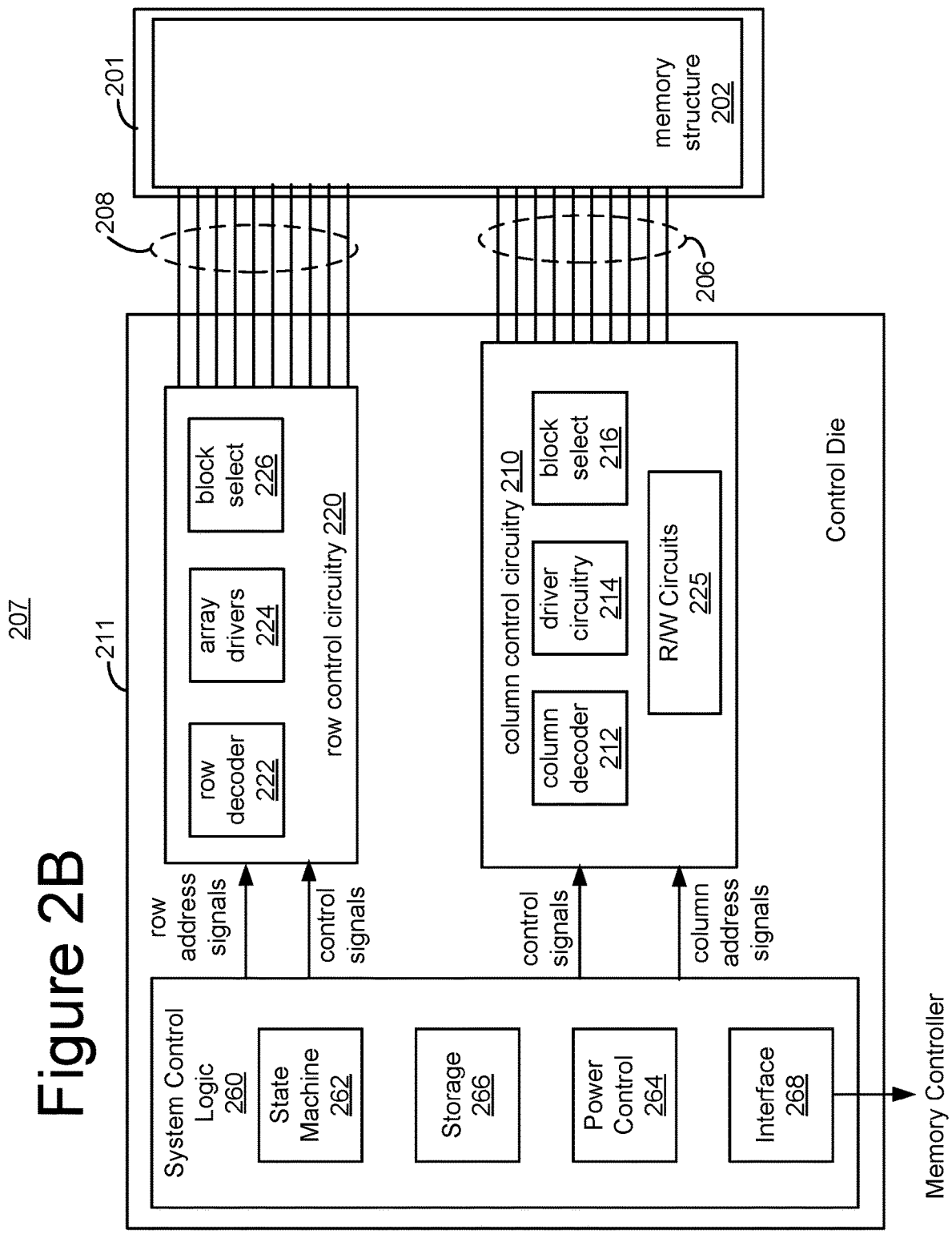
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
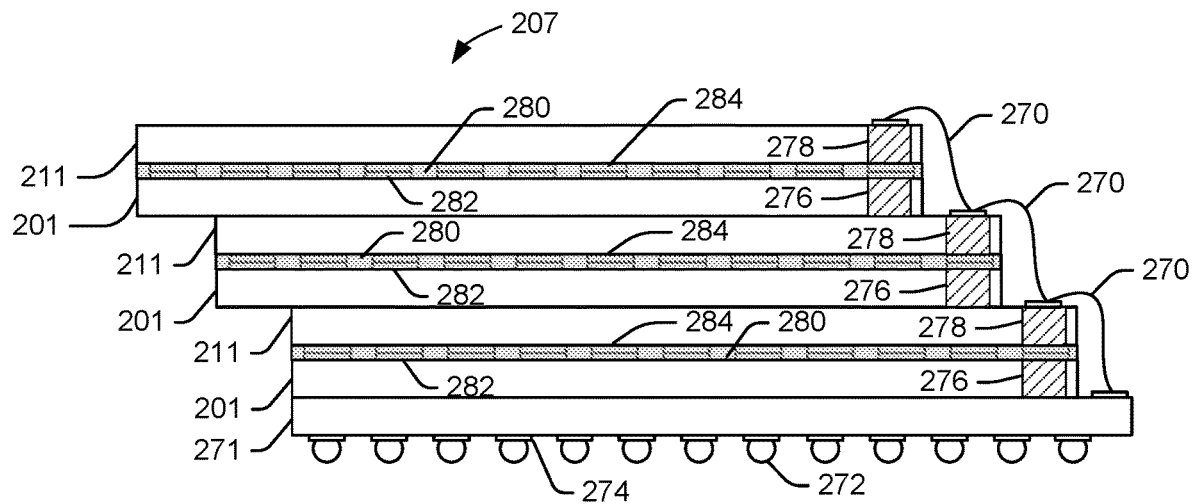
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
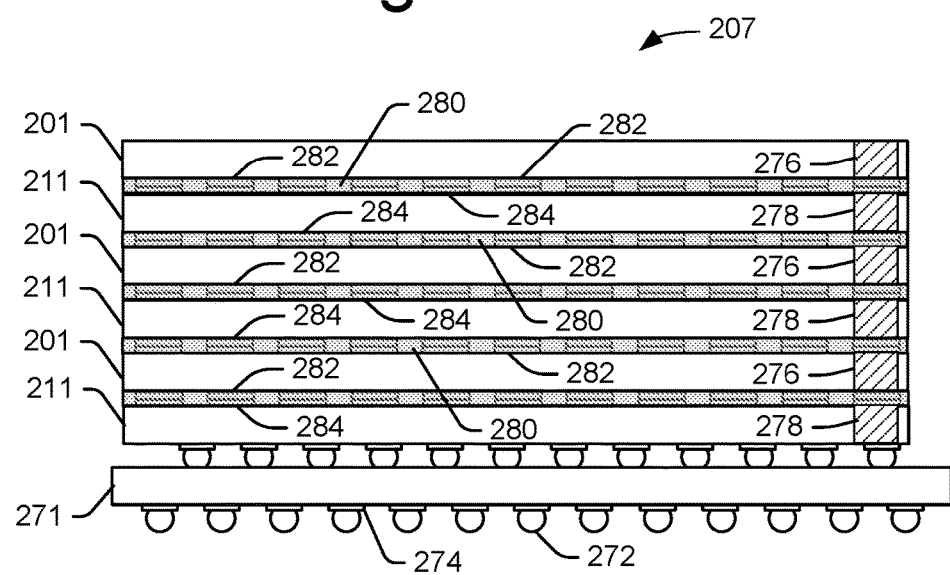

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
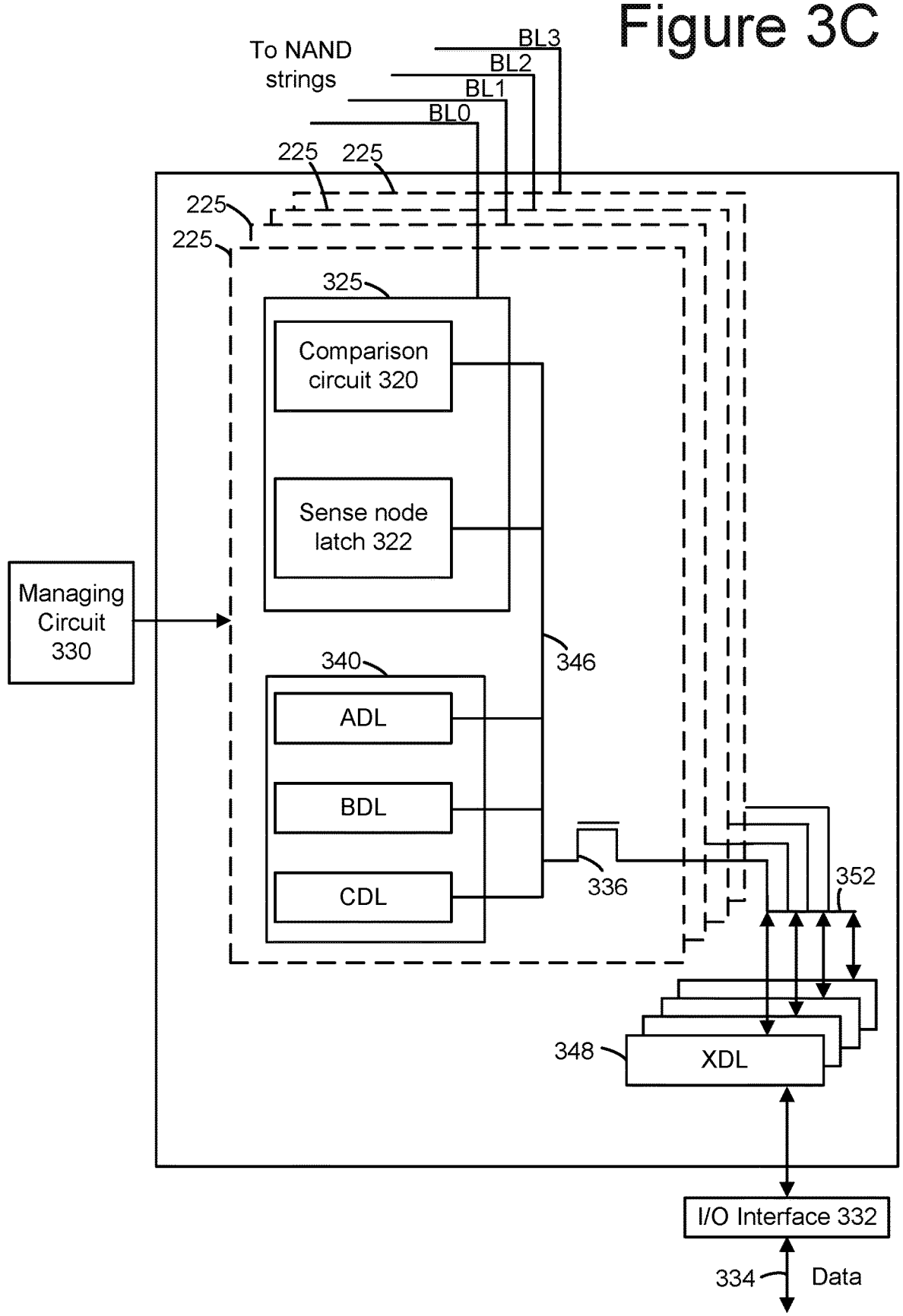
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, V_sense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
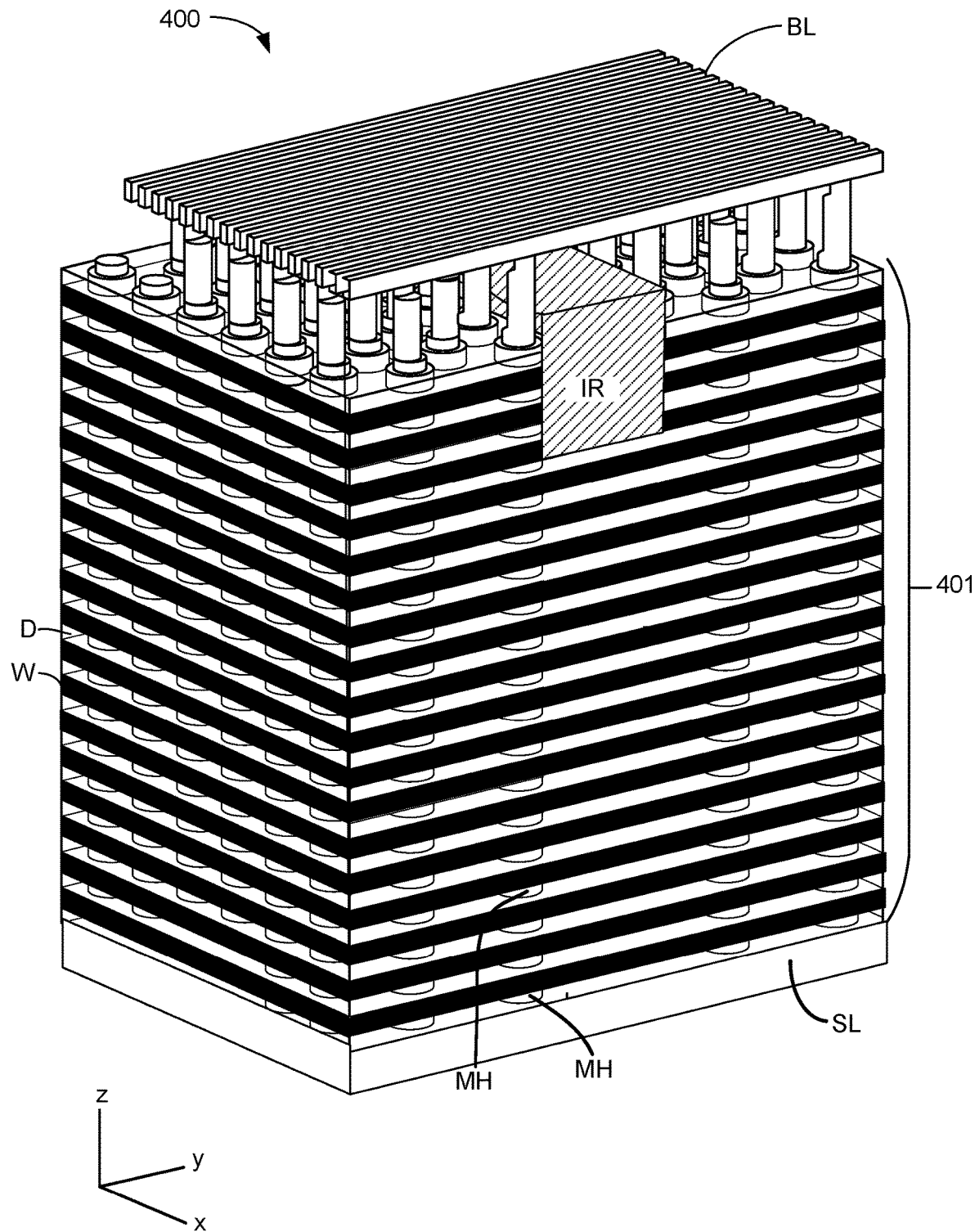
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
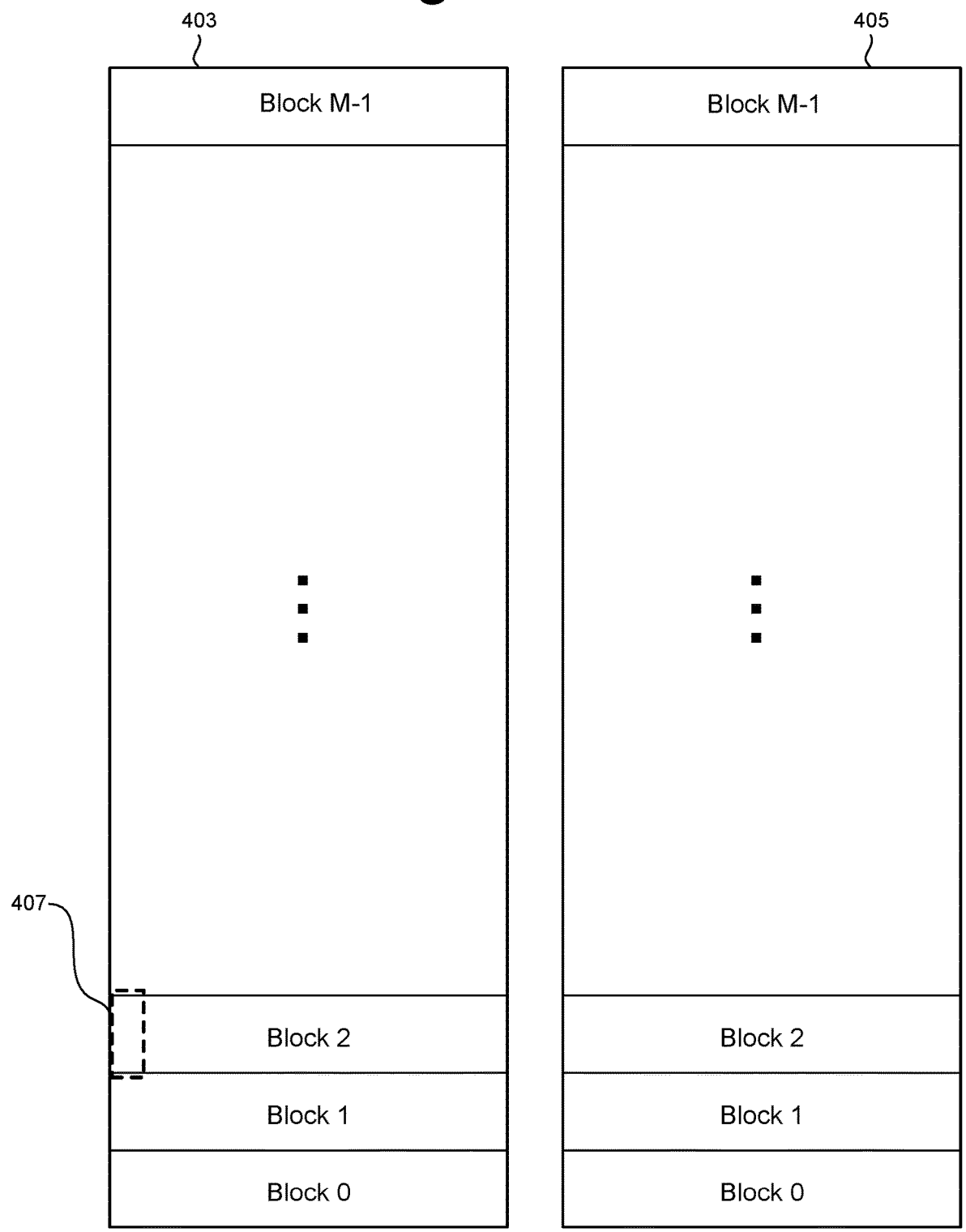
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
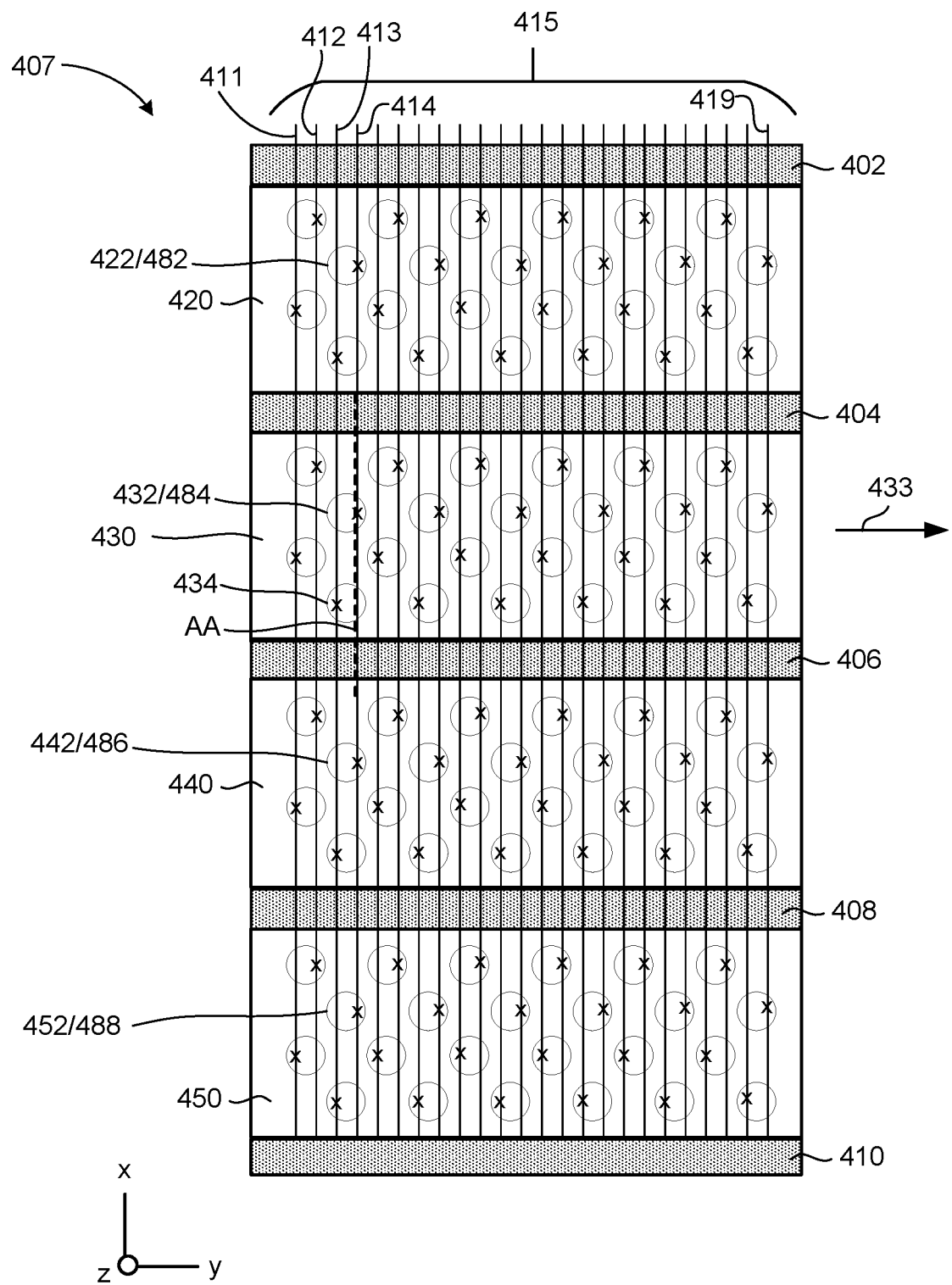
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408 and 410, which are formed of $SiO_2$; however, other dielectric materials can also be used. Isolation regions 402, 404, 406, 408 and 410 serve to divide the top layers of the block into four regions; for example, the top layer depicted in FIG. 4B is divided into regions 420, 430, 440, and 450 of which are referred to as sub-blocks. In one embodiment, isolation regions 402 and 410 separate the block 407 from adjacent blocks. Thus, isolation regions 402 and 410 may extend down to the substrate. In one embodiment, the isolation regions 430, 440, and 450 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/ NAND string in each of regions (sub-blocks) 420, 430, 440, and 450. In that implementation, each block has twenty four rows of active columns and each bit line connects to four rows in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
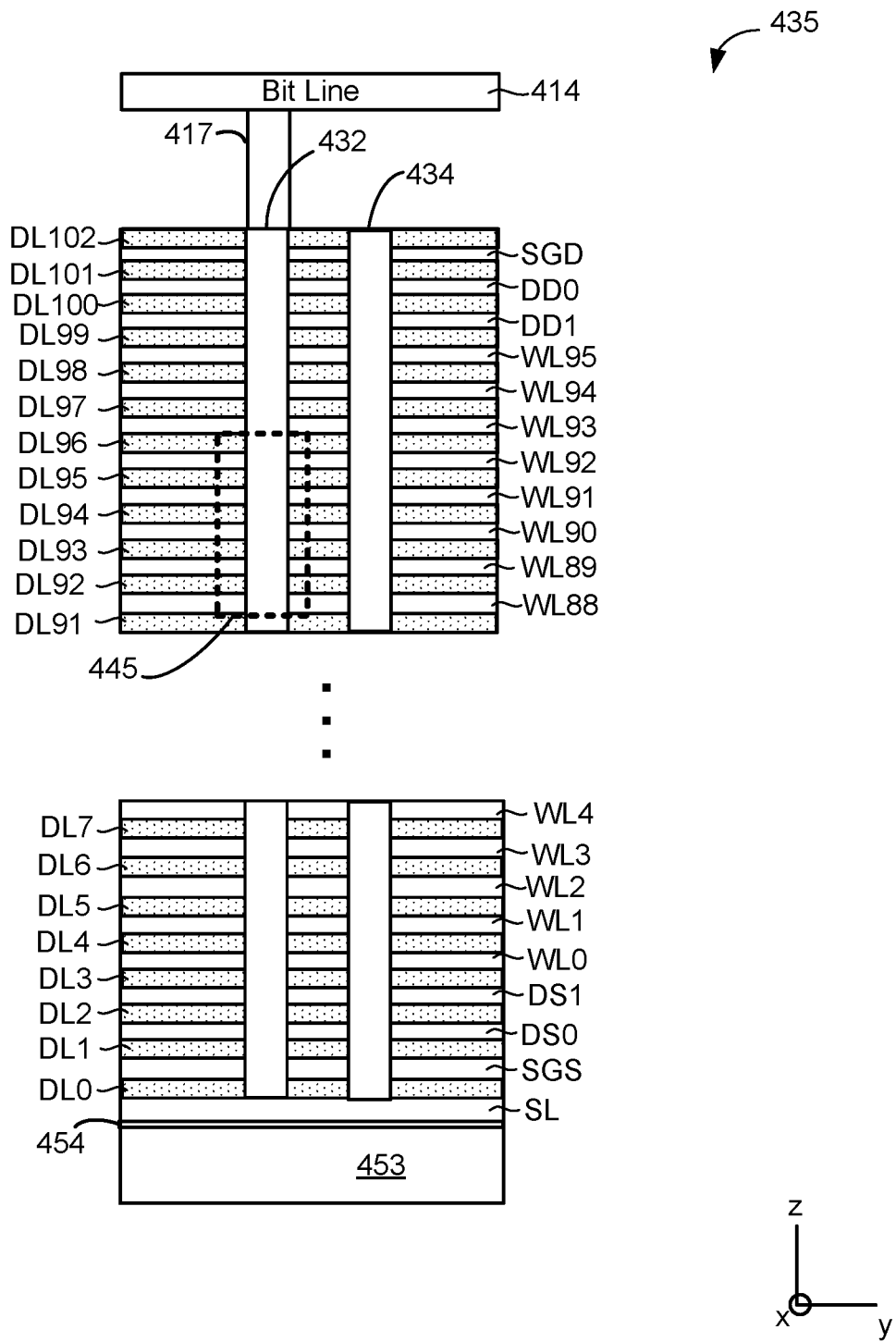
FIG. 4C depicts an embodiment of a stack showing a cross-sectional view along line AA of FIG. 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL95. Each NAND string has a drain side select transistor at the SGD layer. Each NAND string has a source side select transistor at the SGS layer. There may be more than one SGD layer, as well as more than one SGS layer. Also depicted are dielectric layers DL0-DL102.

Columns 432, 434 of memory cells are depicted in the multi-layer stack. The stack includes a substrate 453, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL95 connect to memory cells (also called data memory cells). Dummy word line layers DD, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
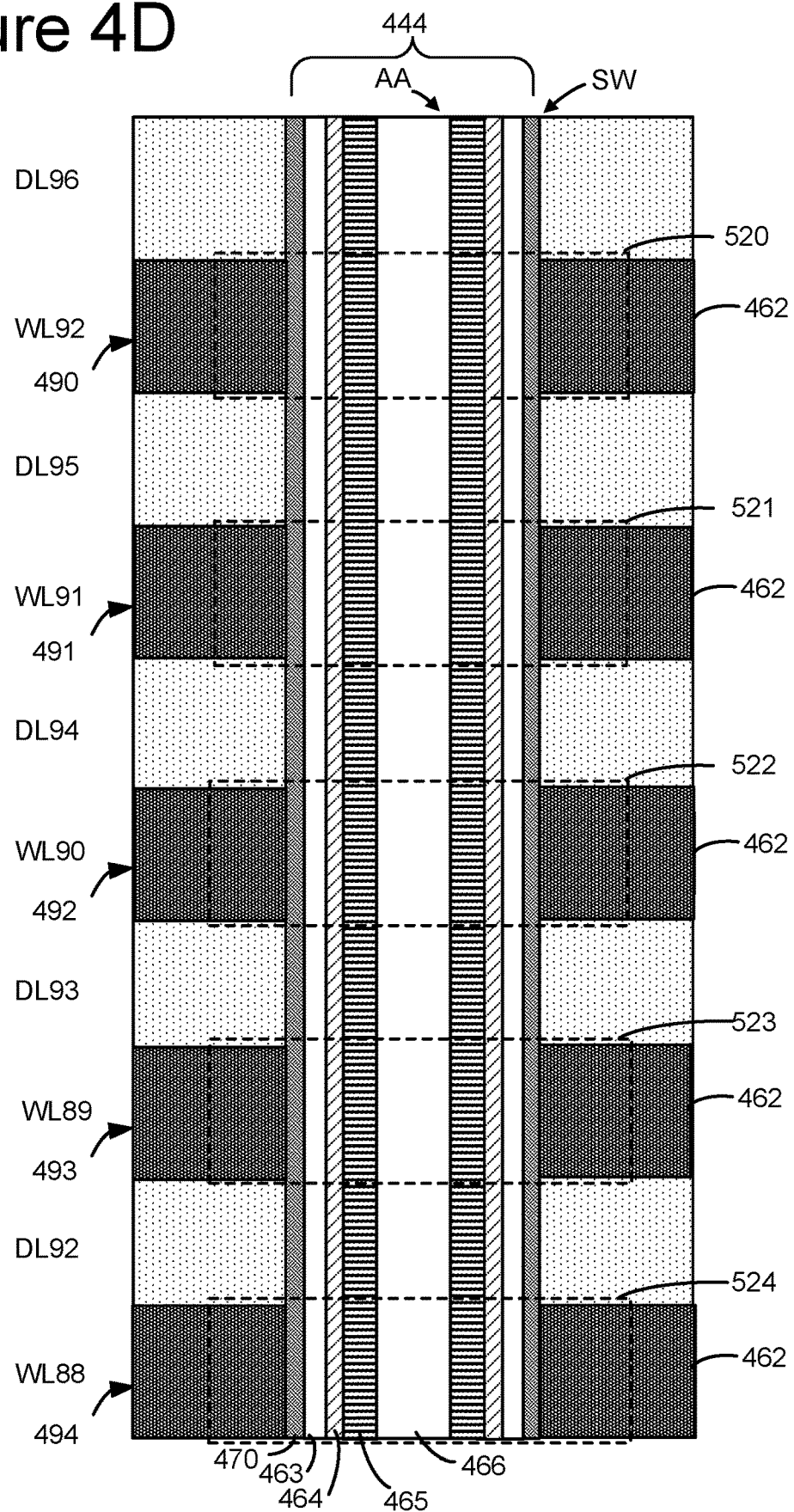
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
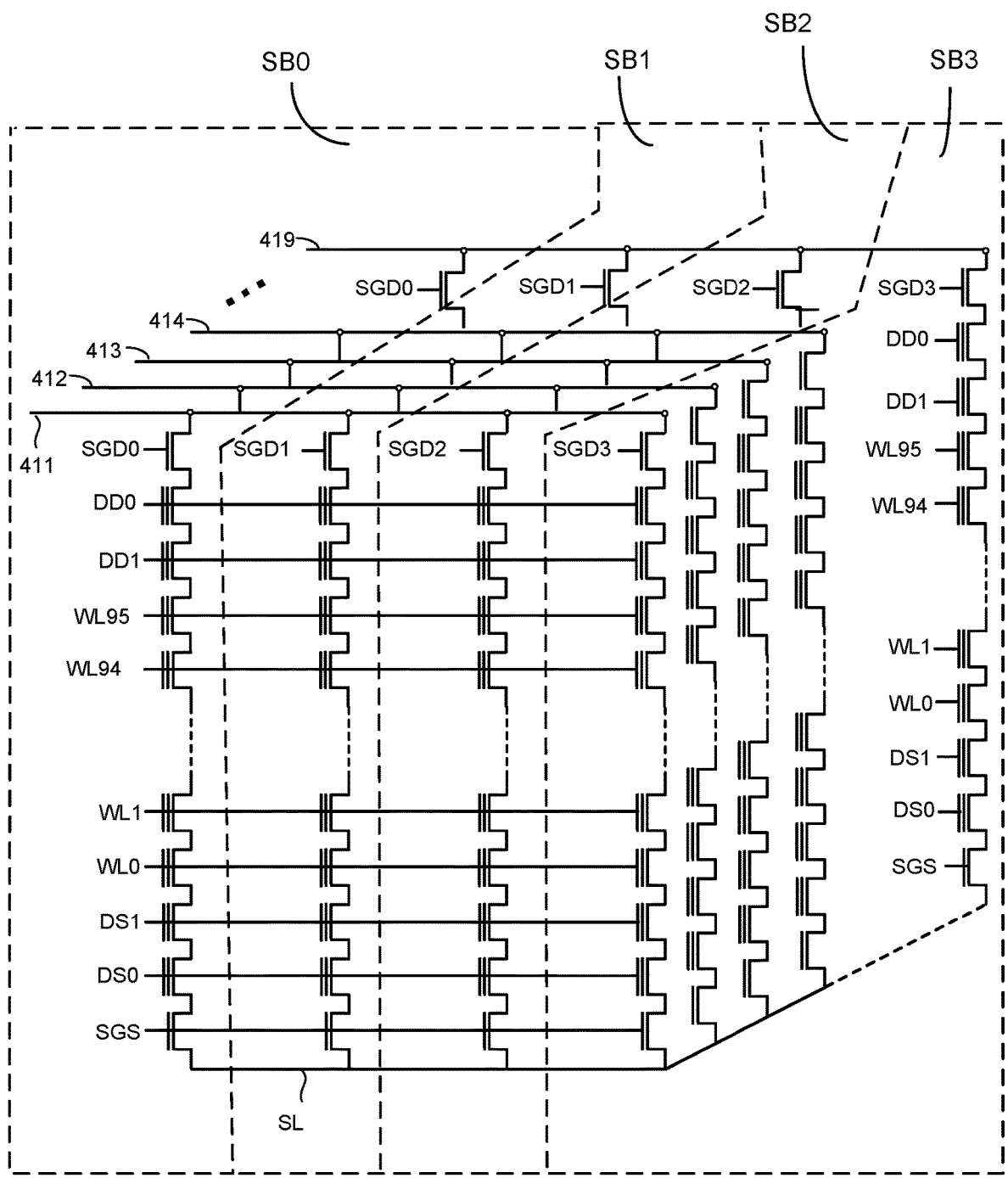
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL95 running across the entire block. The structure of FIG. 4E corresponds to portion 407 in Block 2 of FIGS. 4A-4B, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). A first sub-block corresponds to those vertical NAND strings controlled by SGD0. A second sub-block corresponds to those vertical NAND strings controlled by SGD1. A third sub-block corresponds to those vertical NAND strings controlled by SGD2. A fourth sub-block corresponds to those vertical NAND strings controlled by SGD4. There may be more or fewer than four sub-blocks in a block.

A source side selection line SGS connects/disconnects the NAND strings to/from the common source line. In some embodiments, there is a source side selection line for each sub-block (similar to the four SGD0, SGD1, SGD2, SGD3). The block can also be thought of as divided into four sub-blocks SB0, SB1, SB2 and SB3. Sub-block SB0 corresponds to those vertical NAND strings controlled by SGD0, Sub-block SB1 corresponds to those vertical NAND strings controlled by SGD1, Sub-block SB2 corresponds to those vertical NAND strings controlled by SGD2, and Sub-block SB3 corresponds to those vertical NAND strings controlled by SGD3.

Although the example memories of FIGS. 4-4E are three dimensional memory structure that includes vertical NAND strings with charge-trapping material, other (2D and 3D) memory structures can also be used with the technology described herein.

Figure 5A:
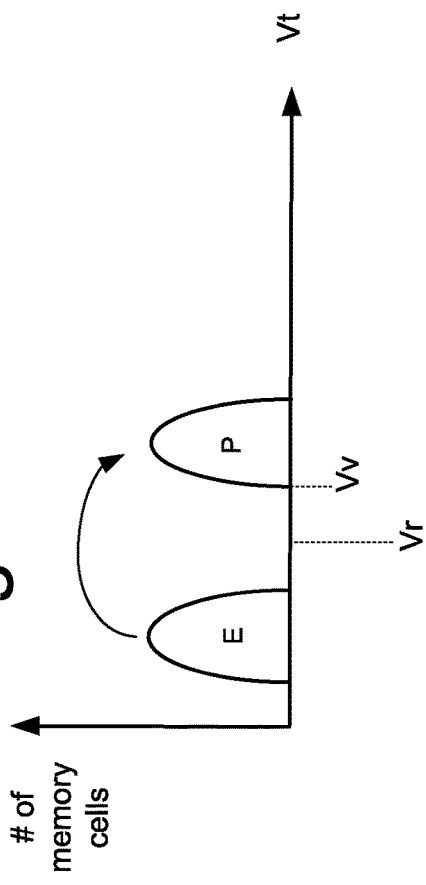
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
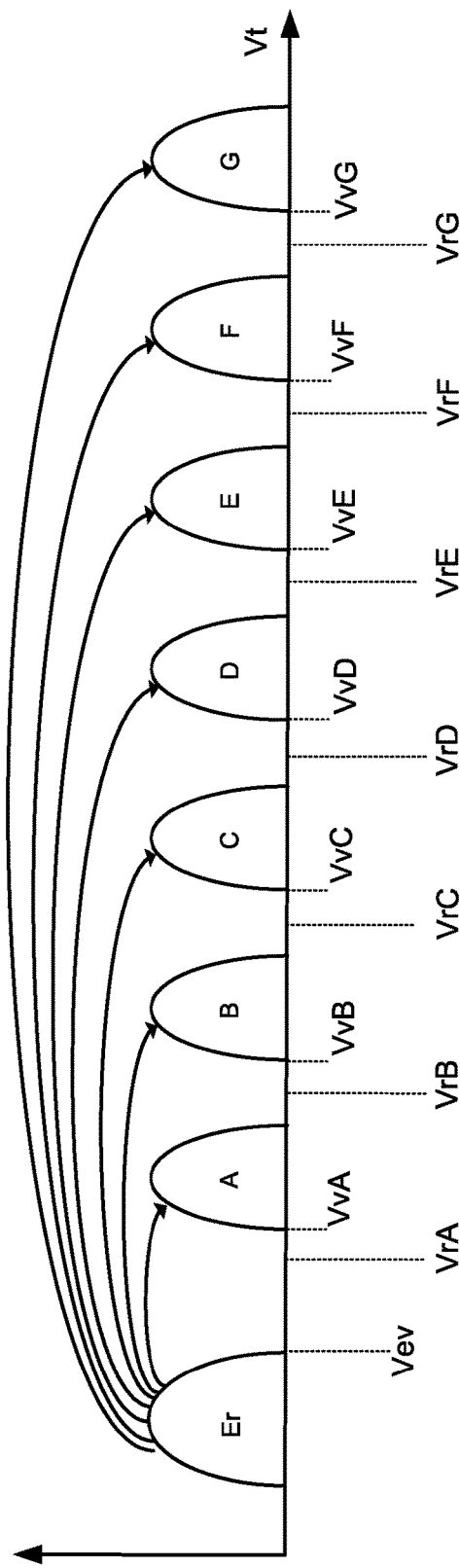

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6:
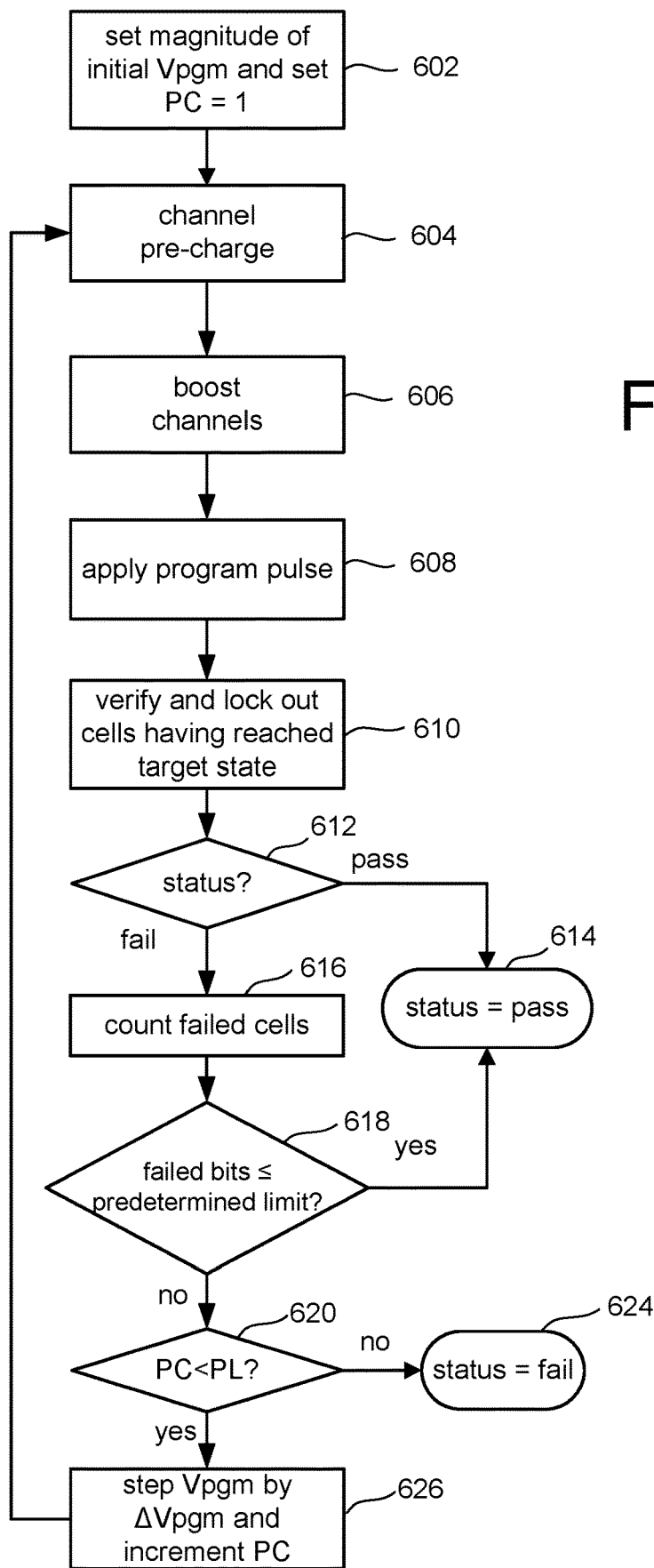
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. In some embodiments, the ramp rate of voltages applied to word lines is controlled to balance programming speed against peak current consumption. Step 610 may also include determining whether a memory cell should receive slow programming during the next program loop, as opposed to full programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B.

Technology is disclosed herein for a memory system that balances peak Icc with programming speed. The peak Icc during verify may vary considerably depending on the word line selected for verify, assuming the same default ramp rate is used for providing voltages to the word lines. Herein, the term "default peak Icc" means the peak Icc during verify of memory cells connected to a selected word line assuming that a default ramp rate is used. The default peak Icc may depend on resistance capacitance (RC) of the word lines and/or NAND strings. When memory cells are programmed charge is added to the charge storage region of the memory cells, which changes RC characteristics of the NAND strings. For example, the NAND channel resistance can change. Therefore, the NAND channel resistance can depend on how many word lines in the block have been programmed. Thus, the default peak Icc for a word line may depend on when it is programmed relative to other word lines. However, other factors may also impact the default peak Icc such as process variation (i.e., semiconductor fabrication process). For example, some word lines could have a higher resistance than others due to systemic process variations. The effect of such systemic process variations can be quantified by experiential analyses of default peak Icc of the various word lines.

Figures 7, 8:
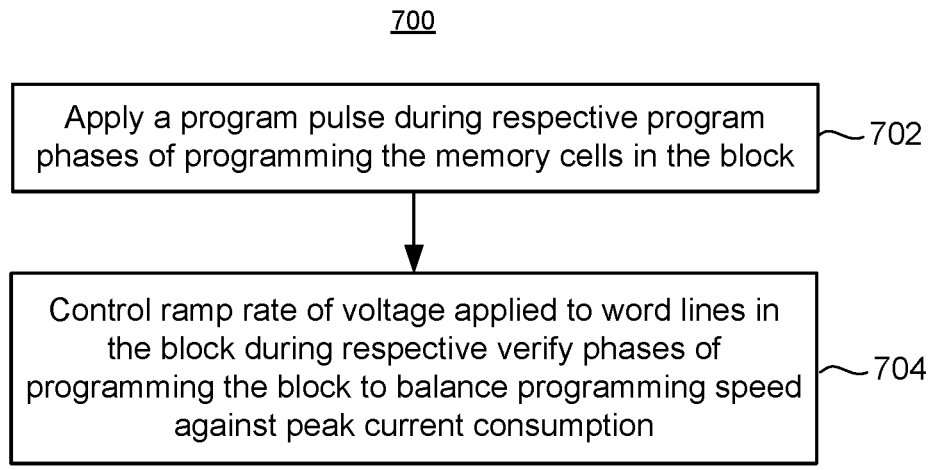
FIG. 7 is a flowchart of one embodiment of a process of programming a block of memory cells, including controlling a ramp rate during verify.
FIG. 8 is an example table in which the word lines are divided into 16 zones, each having a ramp rate for word line voltages during verify.

FIG. 7 is a flowchart of one embodiment of a process 700 of programming a block of memory cells, including controlling a ramp rate during verify. The block may reside within a three-dimensional memory structure having NAND strings. Step 702 includes applying a program pulse to memory cells in a selected block in a three-dimensional memory structure during respective program phases of programming the memory cells in the selected block. In an embodiment, the block is programmed one word line at a time. The word lines may be programmed from one end of the NAND strings to the other. In one embodiment, programming proceeds from the source line end of the NAND string to the bit line end of the NAND string; however, other programming orders can be used. For example, with reference to FIG. 4E, the block can be programmed from WL0 to WL95. In some embodiments, one sub-block (e.g., SB0, SB1, SB2 or SB3) is programmed at a time. The programming of each unit (e.g., sub-block/word line combination) may have a number of program phases and a number of verify phases, as shown and described with respect to FIG. 6.

Step 704 includes controlling a ramp rate of voltages applied to respective word lines in the selected block during the respective verify phases of programming the memory cells in the selected block to balance programming speed against peak current consumption. In an embodiment, the voltages for which the ramp rate is controlled include a read pass voltage (e.g., Vread) that is applied to unselected word lines. In an embodiment, the voltages for which the ramp rate is controlled includes a spike voltage that is applied to the selected word line at the beginning of the verify phase. In an embodiment, the ramp rate of the voltages to the word lines during verify is slow enough to keep the peak Icc during verify to within a target peak Icc regardless of which word line is selected for verify. However, in an embodiment, the ramp rate of the voltages to the word lines during verify is fast enough to make use of the target peak Icc in order achieve faster programming while staying within the target peak Icc. The target peak Icc may be based on the specified peak Icc. For example, the target peak Icc could be equal to the specified peak Icc; however, the target peak Icc is not required to be equal to the specified peak Icc. The specified peak Icc is a peak Icc that the memory system is to draw from a power source based on a specification. Note that steps 702 and 704 may alternate during the programming of a unit (e.g., sub-block/word line combination), as has been shown and described with respect to FIG. 6.

In one embodiment, the memory system stores a table (or other data structure) that specifies a ramp rate for different zones of word lines. In one embodiment, the table is stored in a memory cells in memory structure 202 and loaded into storage 266 when the memory system is powered on. However, the table could be stored elsewhere in the memory system. FIG. 8 is an example table 800 in which the word lines are divided into 16 zones, which provides for a fine level of granularity in the ramp rate. The word line that is selected for verify is the relevant word line for placement in the zones. Each zone could contain the same number of word lines, at least to the extent that is possible. However, some zones could contain significantly more or fewer word lines than others. The table specifies a ramp rate for each zone. For generality, the actual ramp rate is not depicted in FIG. 8. In this example, there is a four bit code associated with each zone. In an embodiment, the code can be used by the memory system to control the ramp rate. For example, the system control logic 260 may issue the code to power control 264, which controls the ramp rate of a charge pump based on the code. In an embodiment, the ramp rate for a given zone is used for all word lines in the block. The zone may be selected based on what zone the selected word line is in. Thus, the ramp rate may depend on the selected word line.

In one embodiment, the ramp rate for a WL zone is determined based on what the peak Icc would be during verify if a default ramp rate were to be used. For some zones, this default peak Icc may be higher than a target peak Icc (depending on the definition of the default ramp rate). For a word line with such a high default peak Icc a slower ramp rate may be used to stay within the target peak Icc. However, slowing down the ramp rate for all zones would unnecessarily slow the programming time. For some zones, the default peak Icc may be well below the target peak Icc, assuming that the default ramp rate were to be used. For such zones, a faster ramp rate may be used to decrease programming time, while staying within the target peak Icc.

Herein a phrase such as "a word line has a peak Icc" is used as shorthand to mean that when that particular word line is the (selected) word line connected to the memory cells being verified that the Icc for the verify operation has that peak Icc. The Icc will depend not only on the voltage that ramps up on that particular (selected) word line but also on the voltage that ramps up on the other (unselected) word lines.

In one embodiment, the zones are based on physical location. In one embodiment, Zone 1 corresponds to word lines at one end of the NAND strings (e.g., source end/drain end), Zone 16 corresponds to word lines at the other end of the NAND strings (e.g., drain end/source end), with the other zones being physically between Zone 1 and Zone 16 based on their physical locations. As depicted in FIG. 4C, word line numbers can be used (e.g., WL0-WL95). As one example, Zone 1 could have a set of the lowest numbered word lines, Zone 2 could have a set of the next lowest numbered word lines, etc. Alternatively, Zone 1 could have a set of the highest numbered word lines, Zone 2 could have a set of the next highest numbered word lines, etc.

Figure 8A:
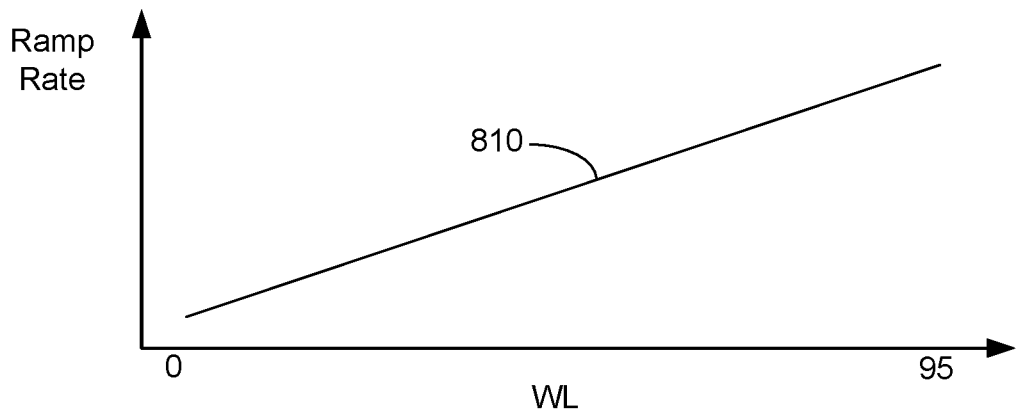
FIGS. 8A, 8B, and 8C depict several examples of a correlation between ramp rate and word line number.
Figure 8B:
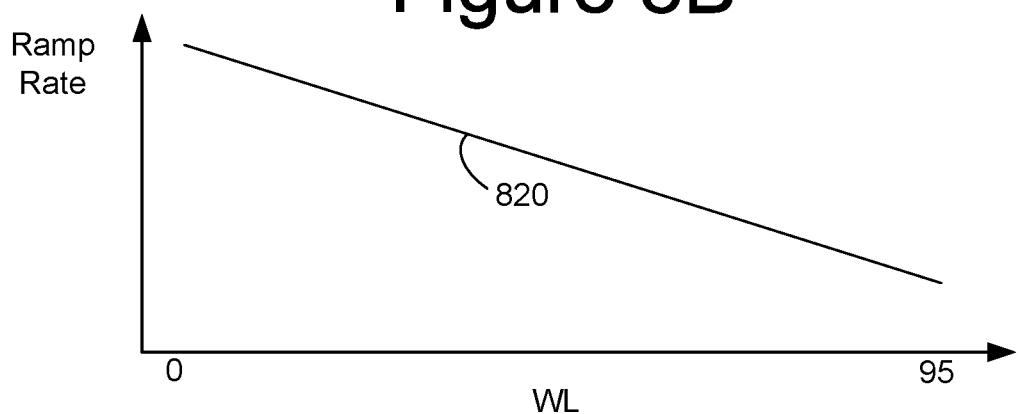
Figure 8C:
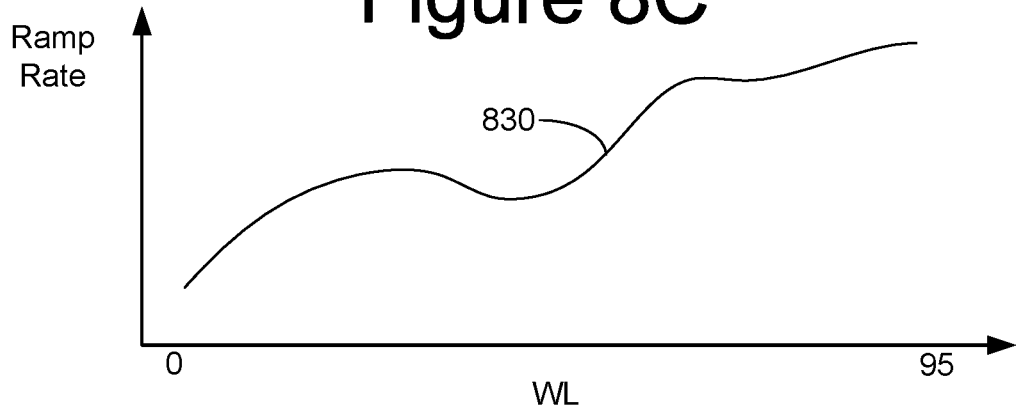

In one embodiment the ramp rate will decrease (or increase) monotonically from one end of the NAND strings to the other end. For example, Zone 1 could have the fastest ramp rate, Zone 2 the next fastest ramp rate, etc., with Zone 16 having the slowest ramp rate. However, it is not required that the ramp rate increases monotonically from one end of the NAND strings to the other end. For example, Zone 6 could have a faster ramp rate than Zone 4 but a slower ramp rate than Zone 8. FIGS. 8A, 8B, and 8C depict several examples of a correlation between ramp rate and word line number (which corresponds to physical location along the NAND strings). FIG. 8A depicts an example in which the ramp rate (plot 810) increases monotonically from lower numbered word line (source end of NAND strings) to higher numbered word line (drain end of NAND strings). FIG. 8B depicts an example in which the ramp rate (plot 820) decreases monotonically from lower numbered word line (source end of NAND strings) to higher numbered word line (drain end of NAND strings). FIG. 8C depicts an example in which the ramp rate (plot 830) is not monotonically increasing or decreasing from one end of the NAND strings to the other end. Note that the plots 810, 820, and 830 are depicted as continuous plots for the sake of illustration. As noted, the word lines may be placed into a number of zones.

Figure 9:
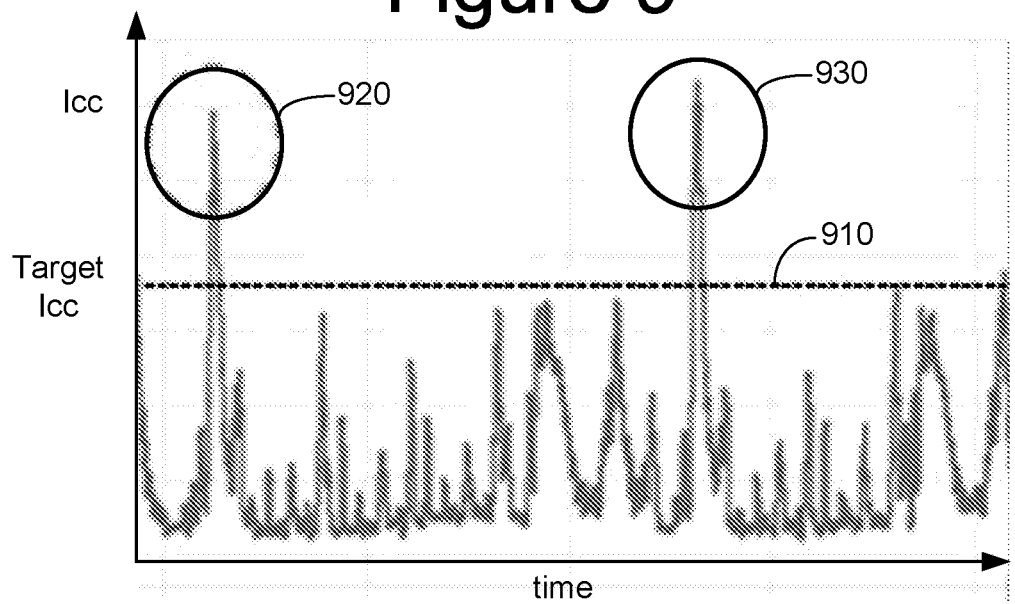
FIGS. 9, 10, and 11 depict three different current profiles during verify.
Figure 10:
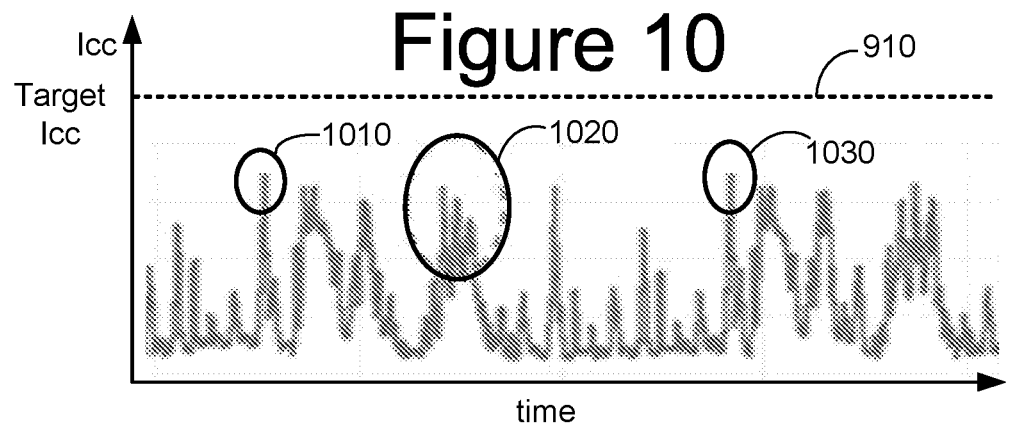
Figure 11:
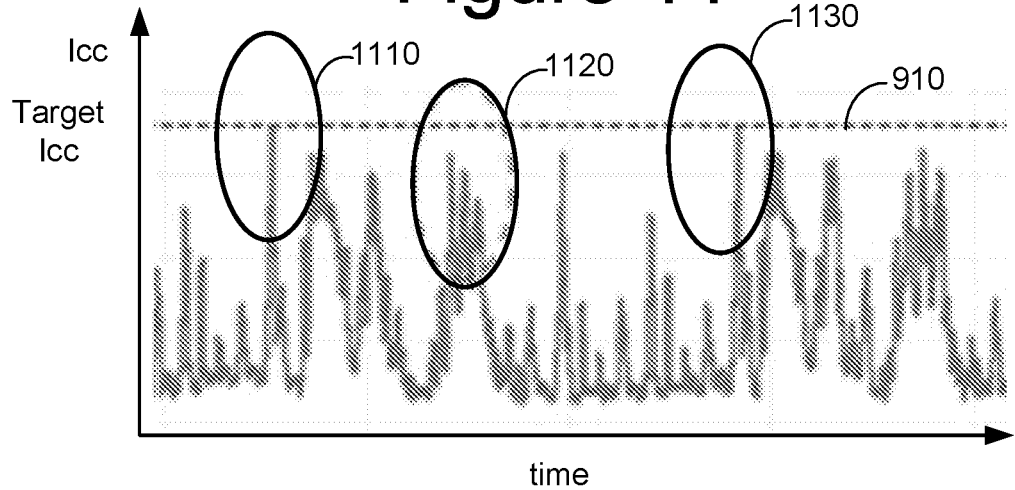

FIGS. 9, 10, and 11 depict three different cases of current usage during verify. This current is referred to as Icc but is not necessarily the entire current consumed by the memory system during verify. In some embodiments, the Icc that is controlled by the ramp rate is the total bit line current during verify. FIG. 9 depicts a case in which peak Icc exceeds a target Icc. FIG. 10 depicts a case in which peak Icc is well below a target Icc. FIG. 11 depicts a case in which peak Icc is equal to the target Icc. The target Icc may be based on the specified Icc. However, the target Icc is not required to be equal to the specified Icc. In some cases, the target Icc for verify could be less than the specified Icc for the memory system due to other elements (e.g., memory controller) using some Icc.

Referring now to FIG. 9, the current (Icc) over time during a verify phase is depicted. Dashed line 910 indicates the target Icc, which in some cases is a maximum allowed peak Icc. The current has a first peak 920 and a second peak 930 that each exceed the target peak Icc. Since exceeding the target Icc is undesirable, the ramp rate of voltages applied to respective word lines during verify may be reduced in order to reduce the peak Icc. Some word lines may have a current profile that has one or more peaks that exceed the target peak Icc if a default ramp rate were to be used. For such word lines, the ramp rate may be reduced to stay within the target Icc 910.

FIG. 10 depicts the current over time during a verify phase for a case in which the peak Icc is well below the target Icc 910. Several current peaks 1010, 1020, 1030 are indicated. Each of these peaks 1010, 1020, 1030 is well below the target Icc 910. Some word lines may have a current profile having all of the peaks well below the peak Icc if a default ramp rate were to be used. For such word lines, the ramp rate may be increased to greater than the default ramp rate to reduce programming time while still staying within the target Icc 910.

FIG. 11 depicts the current over time during a verify phase for a case in which the peak Icc is targeted to the target Icc 910. Several current peaks 1110, 1120, 1130 are indicated. Current peak 1020 is somewhat below the target Icc 910. Current peaks 1110 and 1130 are at the target Icc 910, which make full use of the target Icc 910 in order to achieve fast programming while not exceeding the target Icc 910. Herein a phrase such as, "target a certain peak current" means that the peak Icc during verify is within a tolerance of the certain peak current. In one embodiment, the tolerance is within 5% of the certain peak current.

Figure 12:
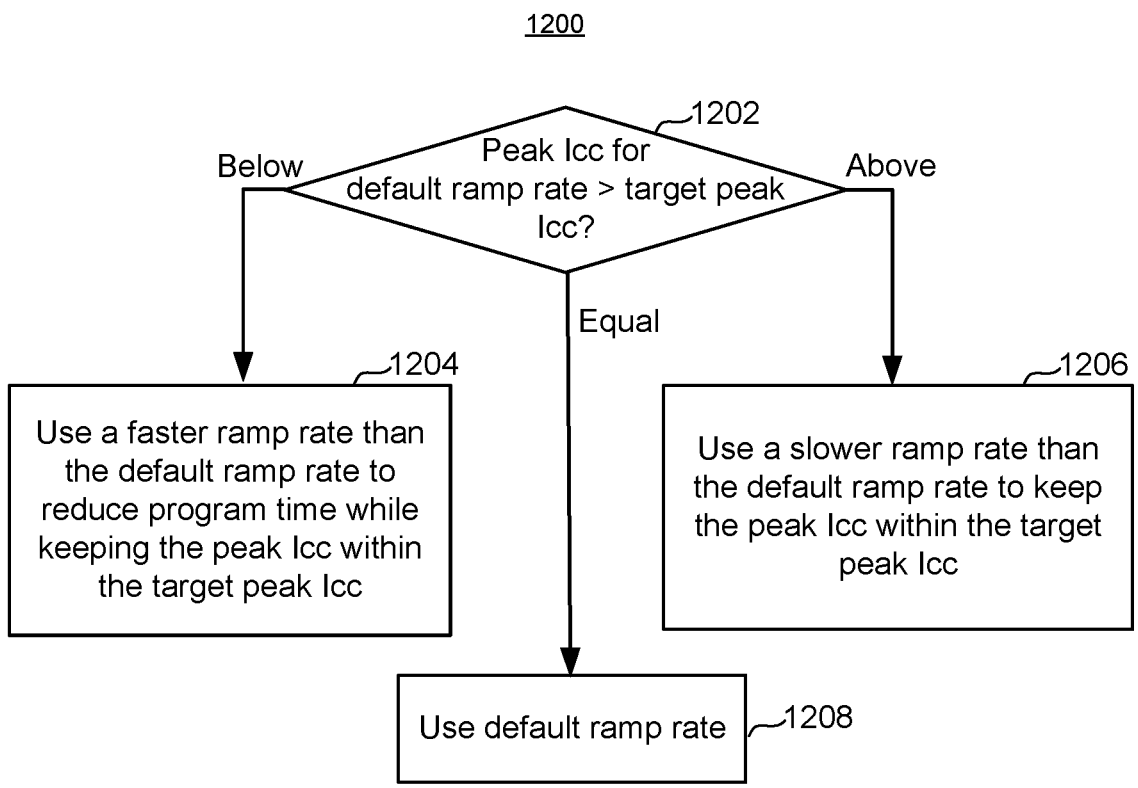
FIG. 12 is a flowchart of one embodiment of a process of controlling a ramp rate of a voltage applied to word lines in a selected block during a verify phase.

FIG. 12 is a flowchart of one embodiment of a process 1200 of controlling a ramp rate of a voltage applied to word lines in a selected block during a verify phase. The process 1200 provides further details of one embodiment of step 704. Process 1200 may be used to balance programming speed against peak current consumption.

Step 1202 is a determination of whether the peak Icc for a default ramp rate is greater than a target peak Icc. The determination may be made offline based on empirical data or simulations. The memory system may store a table that is based on a result of this determination. For example, the table may contain the ramp rate for the word line, which may be based on the peak Icc for the default ramp rate (e.g., slower ramp rate for higher default peak Icc, faster ramp rate for smaller default peak Icc).

If the peak Icc for the default ramp rate is below the target peak Icc, then step 1204 is performed. In step 1204, a faster ramp rate is used than the default ramp rate to reduce programming time while keeping the peak Icc within the target peak Icc. FIG. 10 depicts a current profile that is consistent with an example in which the peak Icc for the default ramp rate is less than the target peak Icc. FIG. 11 depicts a current profile that is consistent with an example in which a faster ramp rate is used than the default ramp rate to reduce programming time while keeping the peak Icc within the target peak Icc. In the example in FIG. 11, the peak Icc is equal to the target Icc. However, programming time can be improved by increasing the ramp rate even if the peak Icc does not reach the target Icc.

If the peak Icc for the default ramp rate is above the target peak Icc, then step 1206 is performed. In step 1206, a slower ramp rate is used than the default ramp rate to keep the peak Icc within the target peak Icc. FIG. 9 depicts a current profile that is consistent with an example in which the peak Icc for the default ramp rate is above the target peak Icc. FIG. 11 depicts a current profile that is consistent with an example in which a slower ramp rate is used than the default ramp rate for such as word line to keep the peak Icc within the target peak Icc.

If the peak Icc for the default ramp rate is approximately equal to the target peak Icc then step 108 is performed. In step 1208, the default ramp rate is used. FIG. 11 depicts a current profile that is consistent with an example in which the default ramp rate is equal to the target peak Icc. Step 1208 may be used to cover cases in which the peak Icc for the default ramp rate is within a tolerance of the target peak Icc, such as, for example, 5%.

Figure 13:
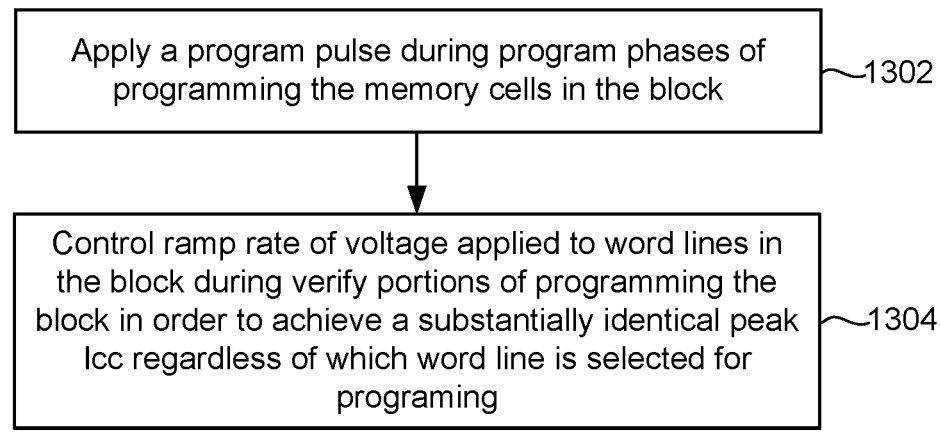
FIG. 13 is a flowchart of one embodiment of a process of programming a block of memory cells.

In an embodiment, the ramp rate of voltages to word lines during verify is controlled to achieve a substantially identical peak Icc regardless of which word line is selected for programming. FIG. 13 is a flowchart of one embodiment of a process 1300 of programming a block of memory cells. Step 1302 includes applying a program pulse to memory cells in a selected block in a three-dimensional memory structure during program phases of programming the memory cells in the selected block. Step 1302 may be similar to step 702 in FIG. 7.

Step 1304 includes controlling a ramp rate of a voltage applied to word lines in the selected block during verify phases of programming the memory cells in the selected block in order to achieve a substantially identical peak current regardless of which word line in the block is selected for programming. In one embodiment, substantially identical means that the peak Icc for the variation word lines are within 5% of each other. Note that steps 1302 and 1304 may alternate during the programming of a unit (e.g., sub-block/word line combination), as has been shown and described with respect to FIG. 6.

Figure 14:
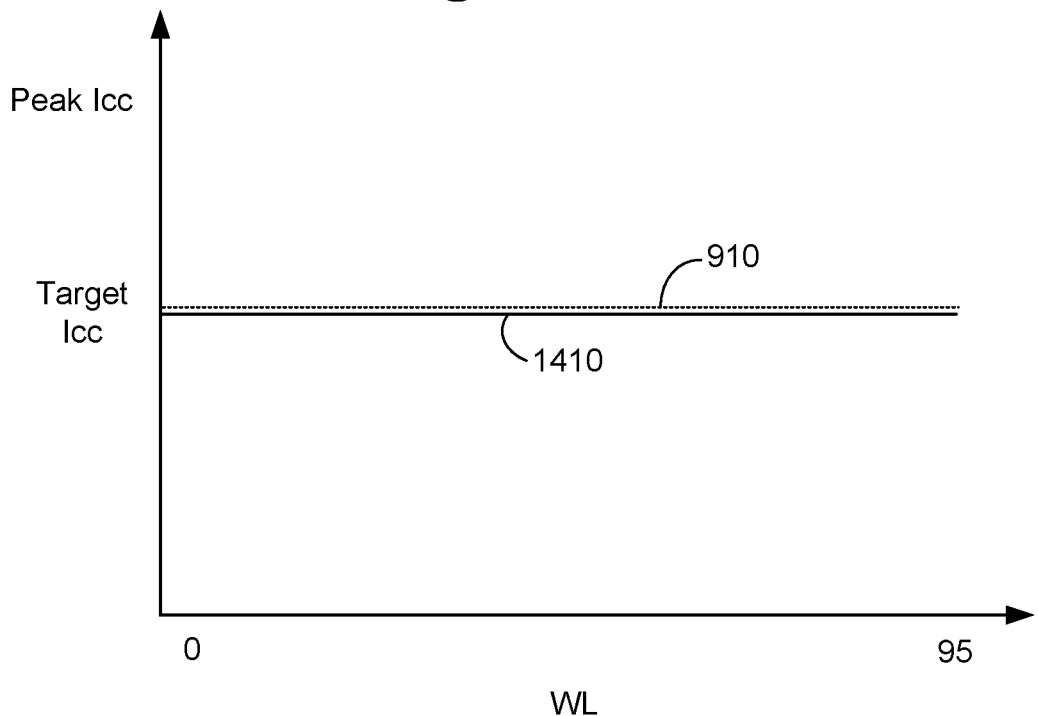
FIG. 14 depicts a graph of one embodiment of peak Icc during verify versus word line number.

FIG. 14 depicts a graph of one embodiment of peak Icc during verify versus word line number. The word line numbers correspond to WL0-WL95 in FIGS. 4C and 4E. The word line numbers correspond to the physical location of the word lines n the block. There could be more or fewer than 96 word lines. Plot 1410 depicts the peak Icc versus word line number for an embodiment consistent with step 1304 in FIG. 13. The peak Icc is substantially the same regardless of which word line is selected for verify. However, the peak Icc is not required to be identical regardless of which word line is selected for verify. For example, there might be about a five percent difference between the word with the lowest peak Icc and the word line with the highest peak Icc. In the example in FIG. 14, the peak Icc is depicted as slightly below the target Icc 910.

Figure 15:
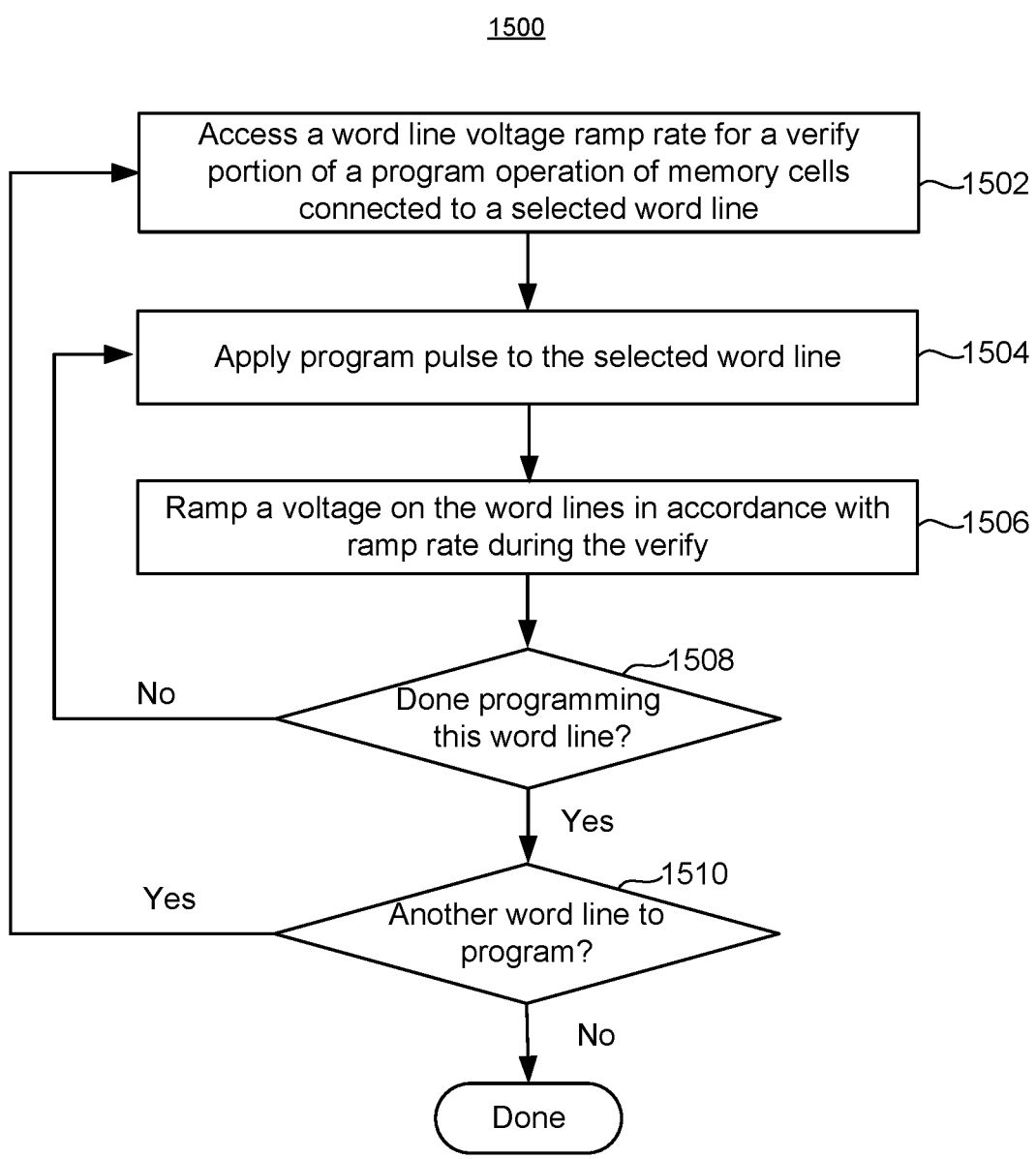
FIG. 15 is a flowchart depicting further details of one embodiment of a process of programming a block of memory cells.
Figure 16:
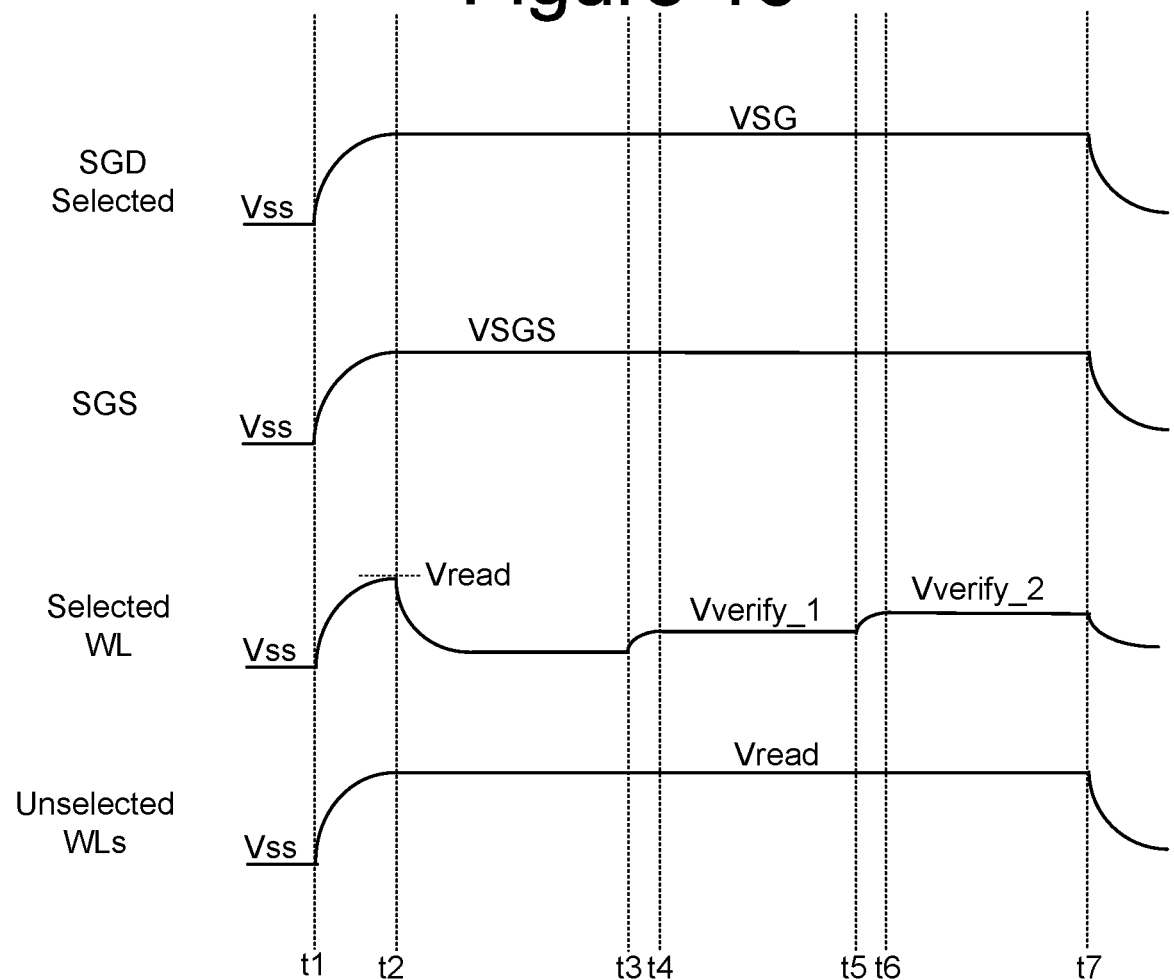
FIG. 16 depicts timing of voltages applied to select lines and word lines during one embodiment of step 1506 in FIG. 15.

FIG. 15 is a flowchart depicting further details of one embodiment of a process 1500 of programming a block of memory cells. Step 1502 includes accessing a word line voltage ramp rate for a verify portion of a program operation of memory cells connected to a selected word line. Step 1504 includes applying program pulse to the selected word line. Step 1506 includes ramping a voltage on the word lines in accordance with ramp rate during the verify. FIG. 16 depicts timing of voltages applied to select lines and word lines during one embodiment of step 1506. To select the sub-block, the drain side select line (SGD) is held at a select voltage (VSG) from t1 until t7. Other sub-blocks within the block are unselected. In one embodiment, the drain side select lines of the unselected sub-blocks are held at VSS (e.g., 0V). The source side select line for the block is held at a select voltage (VSGS) between t1 and t7. Note that, in one embodiment, there is a single source side select line for the entire block. Optionally, there could be a separate source side select line for each sub-block.

FIG. 16 shows the voltages applied to the selected word line (WL) and the unselected WLs. The voltages on the unselected word lines is ramped up from Vss to Vread between t1 and t2. In an embodiment, the ramp rate depends on the location of the selected word line. The voltage is held at Vread between t2 and t7. The read pass voltage (Vread) is a relatively high magnitude voltage that will turn on all unselected memory cells on the NAND strings having a memory cell being sensed (thus acting as pass gates). The voltage on the selected word lines is ramped up from Vss to Vread between t1 and t2. However, the voltage is not kept at Vread. After t2, the voltage on the selected word line is lowered to, for example, Vss. The voltage on the selected word line between t1 and t2 is referred to herein as a spike voltage. In an embodiment, the ramp rate of the spike voltage depends on the location of the selected word line. The voltage on the selected word line is increased between t3 and t4 to a first verify reference level (Vverify_1). The voltage on the selected word line is increased between t5 and t6 to a second verify reference level (Vverify_2). Vverify_1 and Vverify_2 are two different verify reference levels such as two of the levels depicted in FIG. 5B (e.g., VrA, VrA). In general, one or more verify reference voltages will be applied to the selected word line during a verify phase. Thus, two verify references depicted in FIG. 16 is for purpose of illustrating using at least two verify reference voltages during a verify phase. The memory cells may be sensed in response to each of the verify reference voltages.

Returning again to the discussion of FIG. 15, after step 1506 a determination is made whether programming is done for this word line (step 1508). If programming is not complete for this WL, the process returns to step 1504 to apply another program pulse. When programming is complete for this WL, the process moves to step 1510 to determine whether to program another word line. If so, then in step 1502 the ramp rate for the next word line is accessed. Steps 1504-1508 are then performed for this word line. It is not required that all of the word lines in the entire block be programmed without interruption of a memory operation in a different block or even powering down the memory system.

Figure 17:
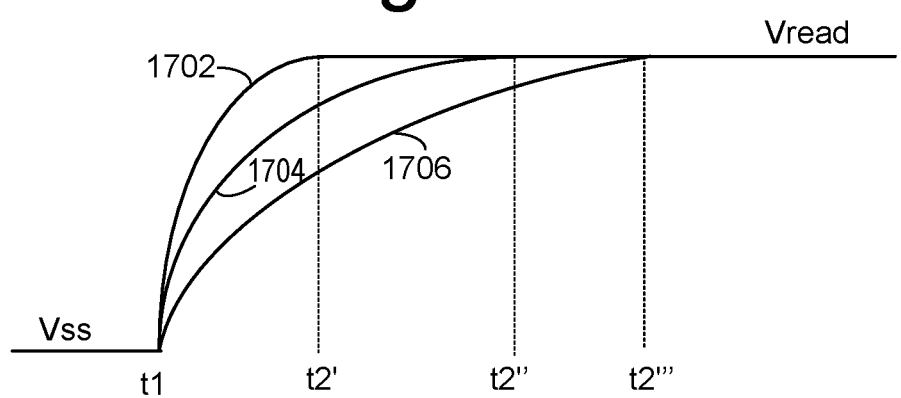
FIG. 17 depicts several different ramp rates for ramping the voltage on the unselected word lines to a read pass voltage.

FIG. 17 depicts several different ramp rates for ramping the voltage on the unselected word lines to Vread. Three ramp rates 1702, 1704, and 1706 are depicted. Each starts at t1. Curve 1702 shows is the fastest ramp rate of the three, reaching Vread at t2'. Curve 1704 shows is the second fastest ramp rate of the three, reaching Vread at t2". Curve 1706 shows is the slowest ramp rate of the three, reaching Vread at t2'". Thus, referring back to FIG. 16, the time gap between t1 and t2 depends on the ramp rate.

The ramp rate is defined herein based on the time between t1 (when the voltage first starts to ramp) and t2 (when the voltage on the word line first reaches its target voltage). There may be some overshoot of the target voltage in which case the time to settle back down to the target voltage is not part of the ramp up time. The ramp rate is defined herein as the ratio of the target voltage (e.g., Vread) divided by the time to first reach the target voltage (t2–t1). The general shape of plots 1702, 1704, and 1704 are shown for purpose of illustration.

In view of the foregoing, a first embodiment includes an apparatus comprising one or more control circuits configured to connect to a three-dimensional memory structure comprising a plurality of NAND strings having memory cells. Each memory cell having a control gate. The three-dimensional memory structure comprising a plurality of word lines. Each word line is connected to the control gates of memory cells on a group of the NAND strings. The one or more control circuits are configured to program memory cells in a selected block in the three-dimensional memory structure. The one or more control circuits are configured to control a ramp rate of voltages applied to respective word lines in the selected block during respective verify phases of programming the memory cells in the selected block to balance programming speed against a peak current during the respective verify phases.

In a second embodiment, in furtherance to the first embodiment, ramping the voltages to the respective word lines in the selected block at a default ramp rate during the verify phases when programming a selected word line has a default peak current. The one or more control circuits use a faster ramp rate than the default ramp rate in response to the default peak current during the verify phases for the selected word line being below a target peak current to reduce program time while keeping the peak current during the respective verify phases within the target peak current.

In a third embodiment, in furtherance to the first or second embodiments, the one or more control circuits are configured to use a slower ramp rate than the default ramp rate in response to the default peak current during the verify phases for the selected word line being above the target peak current to keep the peak current during the respective verify phases within the target peak current.

In a fourth embodiment, in furtherance to any of the first to third embodiments, the one or more control circuits are configured to control the ramp rate of the voltages applied to the respective word lines in the selected block during the verify phases of programming the memory cells in the selected block to achieve substantially a same peak current during the respective verify phases regardless of which word line in the selected block is selected for programming to balance programming speed against peak current consumption.

In a fifth embodiment, in furtherance the any of the first to fourth embodiments, the one or more control circuits are configured to control the ramp rate of the voltages applied to the respective word lines in the selected block during the verify phases of programming the memory cells in the selected block to result in a target peak current regardless of which word line in the selected block is selected for programming.

In a sixth embodiment, in furtherance the any of the first to fifth embodiments, the voltages applied to the respective word lines in the selected block during the verify phases of programming the memory cells in the selected block comprise a read pass voltage applied to unselected word lines.

In a seventh embodiment, in furtherance of the sixth embodiment, the voltages applied to the respective word lines in the selected block during the verify phases of programming the memory cells in the selected block comprise further comprise a spike voltage applied to a selected word line in parallel with ramping up the read pass voltage applied to the unselected words.

In an eighth embodiment, in furtherance to any of the first to seventh embodiments, the one or more control circuits are configured to manage the ramp rate of the voltages applied to the respective word lines in the selected block during verify phases of programming the memory cells in the selected block for at least three different zones of selected word lines having a corresponding at least three different ramp rates. The different ramp rates comprise a first ramp rate for a first zone of the zones, a second ramp rate for a second zone of the zones, and a third ramp rate for a third zone of the zones.

In a ninth embodiment, in furtherance to the eighth embodiment, the first zone comprises a first set of selected word lines; the second zone comprises a second set of selected word lines; the third zone comprises a third set of selected word lines, wherein the second set of selected word lines is between the first set and the third set; and the second ramp rate is faster than the first ramp rate but slower than the third ramp rate.

In a tenth embodiment, in furtherance to the eighth embodiment, the ramp rates for the at least three different zones of selected word lines increase monotonically from a first end of the NAND strings to a second end of the NAND strings.

One embodiment includes a method for programming memory cells in a three-dimensional memory structure. The memory cells are arranged as vertical NAND strings. The method comprises applying a program pulse to memory cells in a selected block in the three-dimensional memory structure during program phases of programming the memory cells in the selected block. The selected block comprises word lines associated with the vertical NAND strings of the selected block. The method comprises controlling a ramp rate of voltages applied to respective word lines in the selected block during verify phases of programming the memory cells in the selected block in order to achieve a substantially identical peak current during the verify phases regardless of which word line in the selected block is selected for programming.

One embodiment includes a non-volatile storage system comprising a three-dimensional memory structure comprising a plurality of vertically oriented NAND strings having memory cells having control gates. The three-dimensional memory structure comprising a plurality of word lines. Each word line is connected to the control gates of memory cells on a group of the NAND strings. Ramping a voltage to the word lines associated with a group of the NAND strings at a default ramp rate during a verify phase when programming a selected word line has a default peak current. The non-volatile storage system comprises one or more control circuits configured to program memory cells on a selected group of the NAND strings in the three-dimensional memory structure. The one or more control circuits are configured to ramp voltages applied to respective word lines associated with the selected group of the NAND strings during verify phases of programming the memory cells connected to a first selected word line at a first rate that is faster than the default ramp rate in response to the first selected word line having a first default peak current for the default ramp rate that is below a target peak current while keeping a peak current during the verify phases within the target peak current.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure comprising a plurality of NAND strings having memory cells, each memory cell having a control gate, the three-dimensional memory structure comprising a plurality of word lines, each word line being connected to the control gates of memory cells on a group of the NAND strings, wherein the one or more control circuits are configured to:
program memory cells in a selected block in the three-dimensional memory structure; and
control a ramp rate of voltages applied to respective word lines in the selected block during respective verify phases of programming the memory cells in the selected block to balance programming speed against a peak current during the respective verify phases.

2. The apparatus of claim 1, wherein ramping the voltages to the respective word lines in the selected block at a default ramp rate during the verify phases when programming a selected word line has a default peak current, wherein the one or more control circuits use a faster ramp rate than the default ramp rate in response to the default peak current during the verify phases for the selected word line being below a target peak current to reduce program time while keeping the peak current during the respective verify phases within the target peak current.

3. The apparatus of claim 2, wherein the one or more control circuits use a slower ramp rate than the default ramp rate in response to the default peak current during the verify phases for the selected word line being above the target peak current to keep the peak current during the respective verify phases within the target peak current.

4. The apparatus of claim 1, wherein the one or more control circuits are configured to control the ramp rate of the voltages applied to the respective word lines in the selected block during the verify phases of programming the memory cells in the selected block to achieve substantially a same peak current during the respective verify phases regardless of which word line in the selected block is selected for programming to balance programming speed against peak current consumption.

5. The apparatus of claim 1, wherein the one or more control circuits are configured to control the ramp rate of the voltages applied to the respective word lines in the selected block during the verify phases of programming the memory cells in the selected block to result in a target peak current regardless of which word line in the selected block is selected for programming.

6. The apparatus of claim 1, wherein the voltages applied to the respective word lines in the selected block during the verify phases of programming the memory cells in the selected block comprise a read pass voltage applied to unselected word lines.

7. The apparatus of claim 6, wherein the voltages applied to the respective word lines in the selected block during the verify phases of programming the memory cells in the selected block comprise further comprise a spike voltage applied to a selected word line in parallel with ramping up the read pass voltage applied to the unselected words.

8. The apparatus of claim 1, wherein the one or more control circuits are configured to:
manage the ramp rate of the voltages applied to the respective word lines in the selected block during verify phases of programming the memory cells in the selected block for at least three different zones of selected word lines having a corresponding at least three different ramp rates, wherein the different ramp rates comprise a first ramp rate for a first zone of the zones, a second ramp rate for a second zone of the zones, and a third ramp rate for a third zone of the zones.

9. The apparatus of claim 8, wherein:
the first zone comprises a first set of selected word lines;
the second zone comprises a second set of selected word lines;
the third zone comprises a third set of selected word lines, wherein the second set of selected word lines is between the first set and the third set; and
the second ramp rate is faster than the first ramp rate but slower than the third ramp rate.

10. The apparatus of claim 8, wherein the ramp rates for the at least three different zones of selected word lines increase monotonically from a first end of the NAND strings to a second end of the NAND strings.

11. A method for programming memory cells in a three-dimensional memory structure, wherein the memory cells are arranged as vertical NAND strings, the method comprising:
applying a program pulse to memory cells in a selected block in the three-dimensional memory structure during program phases of programming the memory cells in the selected block, wherein the selected block comprises word lines associated with the vertical NAND strings of the selected block; and
controlling a ramp rate of voltages applied to respective word lines in the selected block during verify phases of programming the memory cells in the selected block in order to achieve a substantially identical peak current during the verify phases regardless of which word line in the selected block is selected for programming.

12. The method of claim 11, wherein controlling the ramp rate of the voltages applied to the respective word lines in the selected block during the verify phases of programming the memory cells in the selected block in order to achieve the substantially identical peak current regardless of which word line in the selected block is selected for programming comprises:
controlling the ramp rate of the voltages applied to the respective word lines in the selected block during the verify phases of programming the memory cells in the selected block to target a target peak current regardless of which word line in the block is selected for programming.

13. The method of claim 11, wherein controlling the ramp rate of the voltages applied to the respective word lines in the selected block during the verify phases of programming the memory cells in the selected block comprises:
controlling the ramp rate of a read pass voltage applied to unselected word lines in the selected block.

14. The method of claim 13, wherein controlling the ramp rate of the voltages applied to the respective word lines in the selected block during the verify phases of programming the memory cells in the selected block comprises:
controlling the ramp rate of a spike voltage applied to a selected word line in parallel with ramping up the read pass voltage applied to the unselected words.

15. A non-volatile storage system comprising
a three-dimensional memory structure comprising a plurality of vertically oriented NAND strings having memory cells having control gates, the three-dimensional memory structure comprising a plurality of word lines, wherein each word line is connected to the control gates of memory cells on a group of the NAND strings, wherein ramping a voltage to the word lines associated with a group of the NAND strings at a default ramp rate during a verify phase when programming a selected word line has a default peak current; and
one or more control circuits configured to:
program memory cells on a selected group of the NAND strings in the three-dimensional memory structure; and
ramp voltages applied to respective word lines associated with the selected group of the NAND strings during verify phases of programming the memory cells connected to a first selected word line at a first rate that is faster than the default ramp rate in response to the first selected word line having a first default peak current for the default ramp rate that is below a target peak current while keeping a peak current during the verify phases within the target peak current.

16. The non-volatile storage system of claim 15, wherein the one or more control circuits are further configured to:
ramp voltages applied to the respective word lines during the verify phases of programming the memory cells connected to a second selected word line at a second rate that is slower than the default ramp rate in response to the second selected word line having a second default peak current for the default ramp rate that is above the target peak current to keep the peak current during the verify phases within the target peak current.

17. The non-volatile storage system of claim 15, wherein the one or more control circuits are further configured to:
manage the ramp rate for the voltages applied to the respective word lines during the verify phases of programming the memory cells for at least three different zones of selected word lines, wherein the ramp rates comprise a first ramp rate for a first zone of the zones, a second ramp rate for a second zone of the zones, and a third ramp rate for a third zone of the zones.

18. The non-volatile storage system of claim 15, wherein the voltages applied to the respective word lines during the verify phases of programming the memory cells comprises a read pass voltage applied to unselected word lines.

19. The non-volatile storage system of claim 18, wherein the voltages applied to the respective word lines during the verify phases of programming the memory cells further comprises a spike voltage applied to a selected word line in parallel with ramping up the read pass voltage on the unselected words.

20. The non-volatile storage system of claim 15, wherein the one or more control circuits are configured to achieve substantially a same peak current during the verify phases regardless of which word line is selected for programming.

* * * * *